(12) United States Patent
Leeser

(10) Patent No.: US 11,670,535 B2
(45) Date of Patent: *Jun. 6, 2023

(54) CARRIER PLATE FOR USE IN PLASMA PROCESSING SYSTEMS

(71) Applicant: Lam Research Corporation, Fremont, CA (US)

(72) Inventor: Karl Leeser, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 204 days.

This patent is subject to a terminal disclaimer.

(21) Appl. No.: 17/113,848

(22) Filed: Dec. 7, 2020

(65) Prior Publication Data

US 2021/0090936 A1 Mar. 25, 2021

Related U.S. Application Data

(62) Division of application No. 15/343,159, filed on Nov. 3, 2016, now Pat. No. 10,923,385.

(51) Int. Cl.
| | |
|---|---|
| *H01L 21/687* | (2006.01) |
| *H01L 21/683* | (2006.01) |
| *C23C 16/458* | (2006.01) |
| *C23C 16/505* | (2006.01) |
| *C23C 16/50* | (2006.01) |

(52) U.S. Cl.
CPC ...... *H01L 21/68771* (2013.01); *C23C 16/458* (2013.01); *C23C 16/4583* (2013.01); *C23C 16/50* (2013.01); *C23C 16/505* (2013.01); *H01L 21/6831* (2013.01); *H01L 21/6833* (2013.01); *H01L 21/6875* (2013.01); *H01L 21/68735* (2013.01); *H01L 21/68764* (2013.01); *H01L 21/68785* (2013.01)

(58) Field of Classification Search
CPC . C23C 16/458; C23C 16/4583; C23C 16/505; C23C 16/52
USPC .......................................... 156/345.1–345.55
See application file for complete search history.

(56) References Cited

U.S. PATENT DOCUMENTS

| | | | | |
|---|---|---|---|---|
| 5,766,365 | A * | 6/1998 | Umotoy | ............ H01L 21/68735 |
| | | | | 118/500 |
| 5,916,370 | A * | 6/1999 | Chang | ............... H01L 21/68757 |
| | | | | 118/500 |
| 6,350,320 | B1 * | 2/2002 | Sherstinsky | ........ H01J 37/3244 |
| | | | | 118/728 |
| 10,923,385 | B2 * | 2/2021 | Leeser | ................... C23C 16/505 |
| 2002/0059981 | A1 * | 5/2002 | Hao | ................... H01J 37/32623 |
| | | | | 156/345.47 |

(Continued)

*Primary Examiner* — Charlee J. C. Bennett
(74) *Attorney, Agent, or Firm* — Penilla IP, APC

(57) ABSTRACT

A carrier plate for receiving a wafer includes a pocket defined in a middle section on a top surface of the carrier plate and has a surface diameter. The pocket defines a substrate support region. A retaining feature of the carrier plate is defined at an outer edge of the pocket. A tapered portion of the carrier plate extends from the retaining feature to an outer diameter. The tapered portion is configured to receive a focus ring. A bottom surface of the carrier plate is configured to sit over a pedestal that is used in a process chamber. A plurality of wafer supports is disposed on a top surface of the substrate support region to support the wafer, when received.

19 Claims, 14 Drawing Sheets

(56) References Cited

U.S. PATENT DOCUMENTS

| | | | | |
|---|---|---|---|---|
| 2003/0217693 | A1* | 11/2003 | Rattner | ............ H01L 21/68728 |
| | | | | 118/500 |
| 2007/0040265 | A1* | 2/2007 | Umotoy | ............ C23C 16/45521 |
| | | | | 257/704 |
| 2011/0031111 | A1* | 2/2011 | Kobayashi | ........ H01J 37/32623 |
| | | | | 204/298.36 |
| 2011/0049779 | A1* | 3/2011 | Egami | ............... H01L 21/68771 |
| | | | | 29/559 |
| 2012/0267049 | A1* | 10/2012 | Stevens | ............... H01L 21/6875 |
| | | | | 118/723 R |
| 2012/0309175 | A1* | 12/2012 | Masumura | .......... C23C 16/4585 |
| | | | | 257/E21.09 |
| 2013/0112134 | A1* | 5/2013 | Spencer | .................. C30B 15/08 |
| | | | | 117/216 |

* cited by examiner

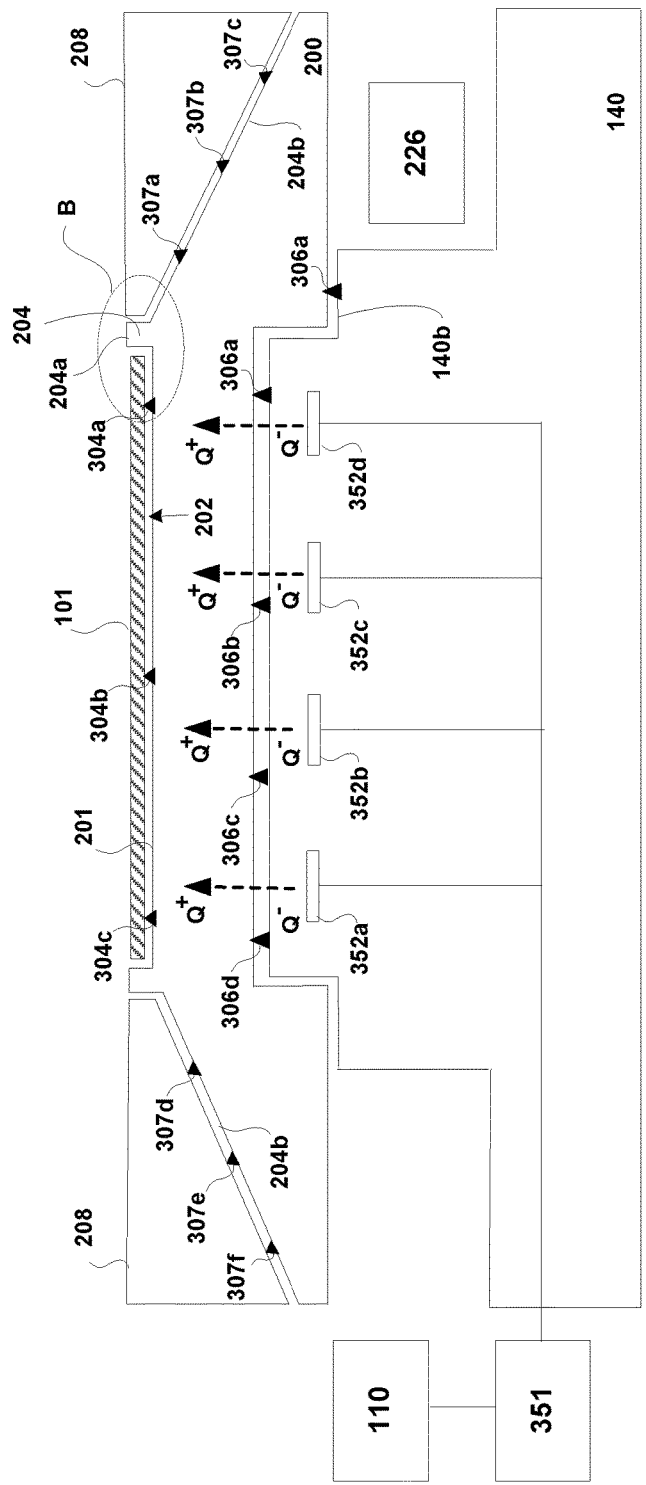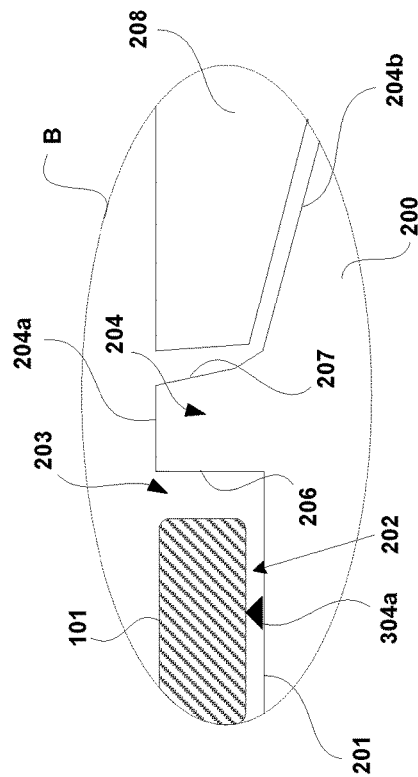
Figure 5E
Figure 5E-1

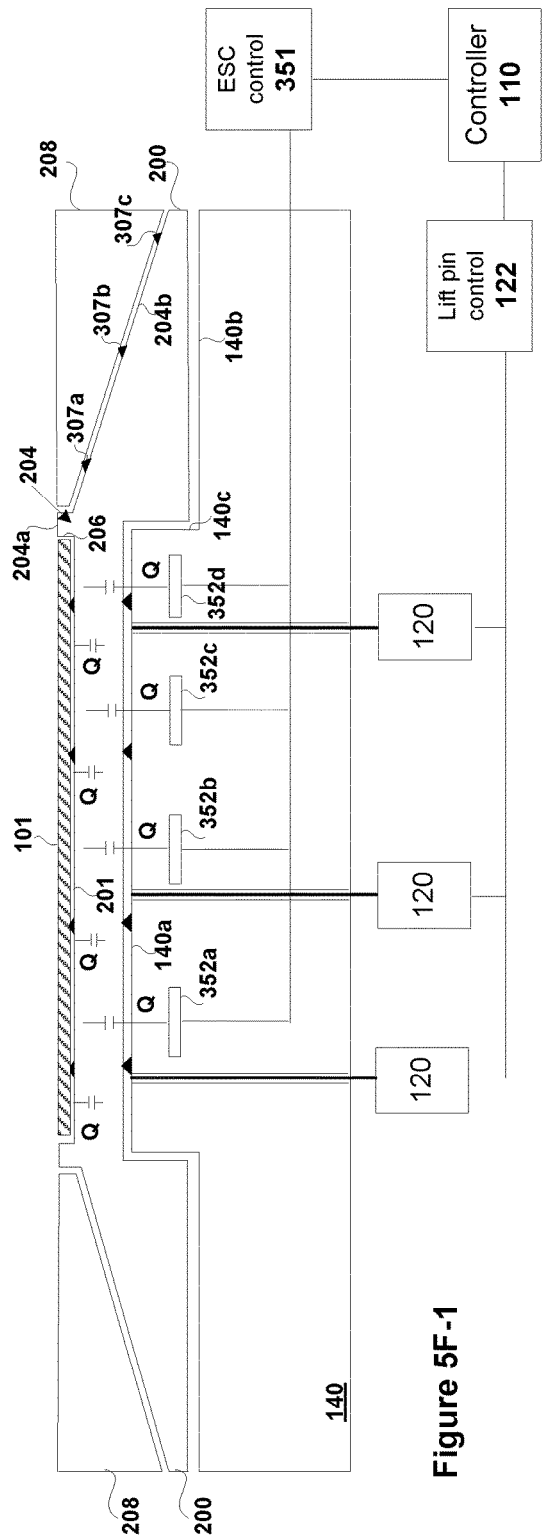
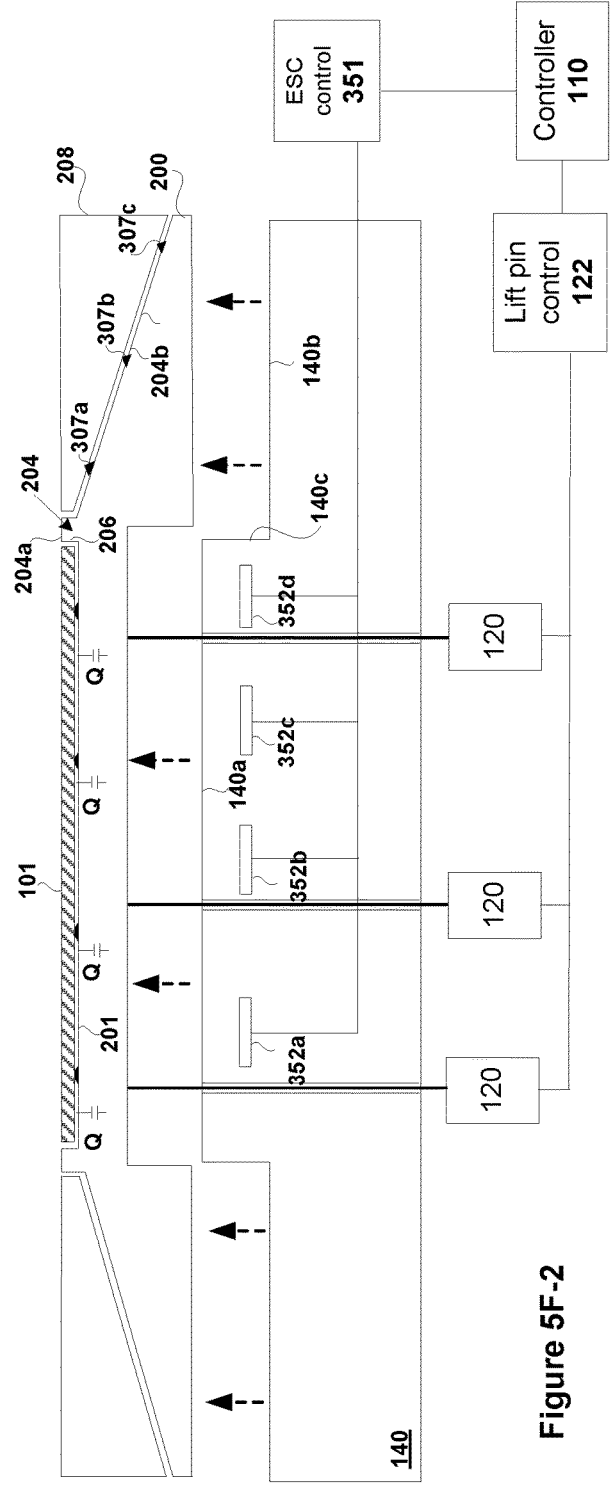
Figure 5F-1
Figure 5F-2

CARRIER PLATE FOR USE IN PLASMA PROCESSING SYSTEMS

CLAIM OF PRIORITY

This Application is a Divisional of and claims benefit and priority to U.S. application Ser. No. 15/343,159, filed on Nov. 3, 2016, entitled "Carrier Plate For Use In Plasma Processing Systems," which is herein incorporated by reference.

FIELD OF THE INVENTION

The present embodiments relate to structures used in semiconductor processing tools, and in particular, to a carrier plate structure that is used for supporting a semiconductor wafer over a pedestal, and methods for using said carrier plate structure for transfers.

BACKGROUND

Description of the Related Art

In wafer processing, such as plasma enhanced chemical vapor deposition (PECVD), a carrier ring assembly is employed to transfer wafer from one station to another. In order to lift the wafer from one process station and position over a next station, a retaining feature is employed in the carrier ring assembly. The retaining feature is designed to extend under the wafer edge, yet not contact the wafer edge during process position. This arrangement leaves lots of gaps around the wafer edge. As a result, in hot PECVD processes, the wafer edge is cooler, experiences different RF coupling than the rest of the wafer, experiences potential or periodic parasitic plasma light-up in the gaps thereby robbing the process of RF power and can cause many other deleterious issues. Further, due to the carrier ring making and breaking contact with the wafers as the wafers are indexed around the processing tool, there is high likelihood that particles generated in the process chamber migrate and deposit on the wafer edge, thereby affecting the die yield.

The temperature discontinuity at the wafer edge where the wafer overhangs the carrier ring retaining feature is tolerable so long as a certain amount of edge exclusion zone (e.g., 3 mm) is maintained, where no wafer dies are formed. However, due to manufacturers pushing the edge exclusion zone farther out (e.g., about 1.8 mm or less), this overhang region is increasingly a source of competitive disadvantage and an engineering challenge to overcome.

Further, the aforementioned deficiencies lead to various sources of non-uniformity in film thickness and other performance metrics. For process modules that employ robots to transfer wafers directly onto a pedestal or chuck by way of lift pins, such variations may cause performance issues. The non-uniformity becomes an issue especially in process modules that have multiple process stations, such as quad station process modules manufactured by Lam Research Corporation. To overcome such issues, a ringless wafer transfer mechanism using carrier rings are employed. However, the carrier rings require coordination, additional mechanisms (e.g., spindle motors) and more automation. Further, the wafer transfer mechanism employing carrier rings requires unacceptably large radial gap in a pocket into which the wafers are received, to account for cumulative handoff errors during transport. In the wafer transfer mechanism, the carrier rings do not fully extend under the wafer but start just at the wafer edge or just beyond. Further, to maintain competitive advantage, newer processes require high precision features to be located in very close proximity to the wafer edge, the very region that is occupied by the carrier ring retaining feature. In order to provide such advantages, deposition on the backside of the wafer, especially at the wafer edge has to be eliminated or significantly reduced.

It is in this context that embodiments of the inventions arise.

SUMMARY

Embodiments of the disclosure provide systems, apparatuses, and methods that employ a detachable carrier plate that supports a wafer, when received, enabling a process similar to carrier ring-like wafer transfer but without the demerits of the carrier ring-like wafer transfer. By way of example, the carrier plate overcomes the limitations of ringless wafer transfer mechanisms and other wafer transfer mechanisms. The carrier plate has a pocket in which the wafer is placed during processing, and the carrier plate is configured to rest upon a pedestal. When the wafer needs to be transported to a different station, the carrier plate, having the wafer thereon, may be lifted and moved to another pedestal. Thus, transfers of the wafer from station to station are enabled by transferring carrier plate, without the need to lift the wafer from the supporting surface of the carrier plate.

In a specific example, of a process chamber that is used for deposition, such as PECVD, a wafer is received and supported on a carrier plate, which is received on a pedestal of the process chamber. The carrier plate includes a pocket that covers a surface that extends at least a diameter of a wafer, when received. The sides and bottom of the pocket are continuous as they are formed of a single component structure. The pocket defines a substrate support region. In one embodiment, the wafer remains in contact with the carrier plate during processing and transfers. As a result, when the carrier plate is moved to effect wafer transfer, such movement does not require making or breaking contact with the wafer. This design of the carrier plate also eliminates the gaps under the edge of the wafer. Wafer-carrier plate spacing features, such as small bumps offering minimum contact areas, can be made quite small by fabricating the spacing features directly into the substrate support region of the carrier plate. Such precision fabrication of the spacing features minimizes the gaps on the underside of the wafer. In one embodiment, a hybrid wafer receiving mechanism may be designed by using ceramic for the carrier plate and metal for the pedestal. This hybrid structure preserves the simplicity and throughput benefits of a ring transfer mechanism while addressing the limitations of the ring transfer mechanism.

The various embodiments discussed herein provide numerous benefits over traditional wafer transfer mechanisms. One of the benefits includes elimination of temperature discontinuity at the wafer edge. Another benefit is the elimination of gaps around the wafer edge that could result in parasitic plasma light-up or discontinuous high frequency transmission impedance. Particle contamination at the edge and underside of the wafer is reduced as the carrier plate provides a high precision pocket feature extending under the wafer and wrapping around the critical region near the wafer edge. The carrier plate remains in contact with the wafer as the carrier plate with the wafer is moved as a unit from one station to another. As a result, there is no need for a separate transfer mechanism to lift the wafer out of the pocket. The carrier plate provides a surface upon which the wafer can be placed with high precision by a robot without incurring eccentric handoff, such as those that are involved in traditional spindle-carrier ring handoff. The carrier plate provides a low cost solution by combining a high precision, ceramic surface under the wafer and a low cost metal (e.g., aluminum) pedestal on which the carrier plate is received.

In one embodiment, a process chamber used for processing a wafer, is disclosed. The process chamber includes a pedestal that is configured to receive a carrier plate. The pedestal has a top surface and an annular surface. The top surface of the pedestal is defined in a middle section of the carrier plate and extends a surface diameter. The annular surface of the pedestal is separated from the top surface by a step down that is defined by a first height. The annular surface extends outward from the surface diameter of the top surface to an outer diameter of the pedestal. The carrier plate has a pocket defined in a middle section on a top surface of the carrier plate and extends to at least the surface diameter. A retaining feature is disposed adjacent to an outer edge of the pocket. A tapered portion extends from the retaining feature to an outer diameter of the pedestal. The pocket defines a substrate support region to support a wafer, when received. A plurality of carrier supports is distributed along the top surface of the pedestal. The plurality of carrier supports defines minimum contact areas offering reliable support for the carrier plate, when received.

In another embodiment, a carrier plate for receiving a wafer, is disclosed. The carrier plate includes a pocket defined in a middle section of the carrier plate and has a surface diameter. The pocket defines a substrate support region. A retaining feature is defined in the carrier plate at an outer edge of the pocket. A tapered portion is defined in the carrier plate and is configured to extend from the retaining feature to an outer diameter. The tapered portion is configured to receive a focus ring. A bottom surface of the carrier plate is configured to sit over a pedestal. A plurality of wafer supports is disposed on a top surface of the substrate support region to support the wafer, when received.

Other aspects and advantages of the invention will become apparent from the following detailed description, taken in conjunction with the accompanying drawings, illustrating by way of example the principles of the invention.

BRIEF DESCRIPTION OF THE DRAWINGS

FIG. 3 illustrates a top view of a multi-station processing tool of a substrate processing system with wafer blades used to move the carrier plates, in accordance with an alternate embodiment.

FIG. 5A-1 illustrates an expanded view of an edge portion of the wafer received in a pocket identified in FIG. 3A, in accordance with an embodiment of the invention.

FIGS. 5C-1 and 5C-2 illustrate cross-section views of peripheral portion of the wafer, including a carrier plate that is used for receiving a focus ring, in accordance with alternate embodiments of the invention.

FIGS. 5D-1 and 5D-2 illustrate cross-section views of peripheral portion of the wafer received on a carrier plate, in accordance with alternate embodiments of the invention.

FIG. 5E illustrates a cross-section view of a carrier plate identifying details of an electrostatic chuck arrangement, in accordance with an embodiment of the invention.

FIG. 5E-1 illustrates an expanded view of a peripheral portion of a wafer received in a pocket of a carrier plate identifying details of the carrier plate, in accordance with an embodiment of the invention.

FIG. 5F-1 illustrates an expanded cross-section view of a carrier plate that includes a plurality of lift pins distributed in a body of the pedestal, in a disengaged state, in accordance with an embodiment of the invention.

FIG. 5F-2 illustrates a cross-section view of a carrier plate with the plurality of lift pins in an engaged state, in accordance with an embodiment of the invention.

DESCRIPTION

Embodiments of the disclosure provide various details of a carrier plate that is used in a process chamber. The carrier plate may be used in a process chamber that includes one pedestal or multiple pedestals. In one configuration, if the process chamber includes a set of pedestals, the process chamber will have a similar set of carrier plates. Wafers are loaded onto carrier plates, and the carrier plates may be moved from one pedestal to another pedestal, without removing the wafer from the respective carrier plates. In one configuration, when a carrier plate is transferred, the system may simultaneously transfer all carrier plates, e.g., by a rotating assembly. In this manner, all carrier plates are transferred to a different pedestal to enable further processing in the process chamber. It should be appreciated that the present embodiments can be implemented in numerous ways, such as a process, an apparatus, a system, a device, or a method. Several embodiments are described below.

Deposition of films can be implemented in a plasma enhanced chemical vapor deposition (PECVD) system. The PECVD system may take many different forms. The PECVD system includes one or more chambers or "reactors" that are suitable for wafer processing. Each chamber may include multiple stations to house one or more wafers for processing. The one or more chambers maintain the wafer in a defined position or positions (with or without motion within that position, e.g. rotation, vibration, or other agitation). A wafer undergoing deposition may be transferred into and out of the reactor chamber and from one station to another within a reactor chamber during processing. Of course, the film deposition may occur entirely at a single station or any fraction of the film may be deposited at any number of stations.

While in process, the wafer is held in place by a carrier plate that is received on a pedestal, a wafer chuck and/or other supporting apparatus. For certain operations, the apparatus may include a heater such as a heating plate to heat the wafer.

Figure 1A:
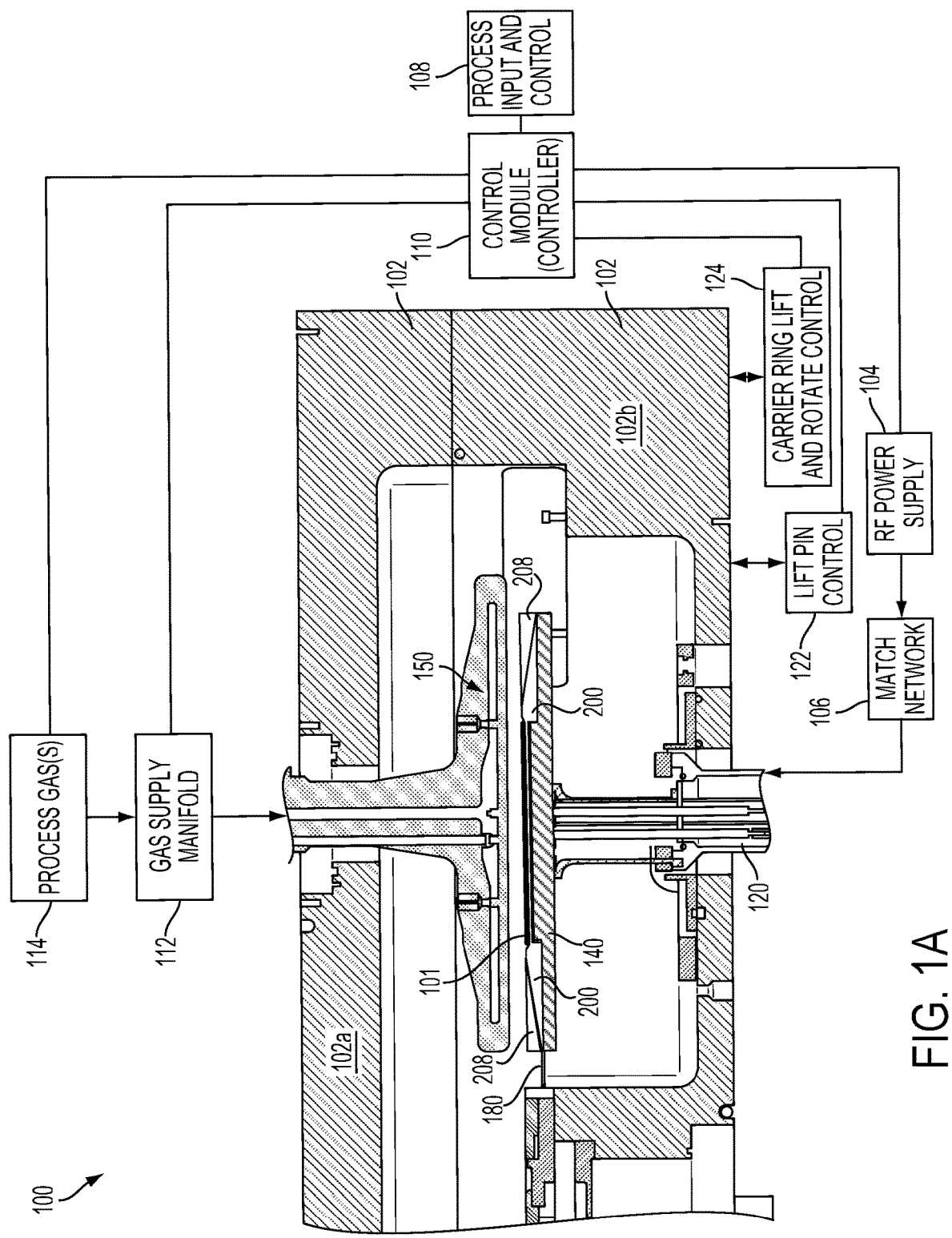
FIG. 1A illustrates a substrate processing system, which is used to process a wafer, e.g., to form films thereon, in accordance with one embodiment.

FIG. 1A illustrates an example substrate processing system 100, which is used to process a wafer 101. The system includes a process chamber 102 having an upper chamber portion 102a and a lower chamber portion 102b. A center column is configured to support a pedestal 140. In one embodiment, the pedestal 140 is a powered electrode. In this embodiment, the pedestal 140 is electrically coupled to a power supply 104 via a match network 106. The power supply is controlled by a control module 110, e.g., a controller. The controller 110 is configured to operate the substrate processing system 100 by executing inputs provided by process input and control 108. The process input and control 108 may provide process recipe inputs, such as power levels, timing parameters, process gasses, inputs to control mechanical movement of the wafer 101, etc., so as to deposit or form films over the wafer 101.

In one embodiment, the center column is shown to include at least a portion of a lift pin mechanism. The lift pin mechanism includes lift pins 120, which are controlled by lift pin control 122. In the embodiment illustrated in FIG. 1A, the lift pin is shown to be disposed in the central column. It should be noted that in other embodiments, the lift pins may be disposed anywhere in the body of the pedestal 140 and is not restricted to just the central column. The lift pins 120 are used to raise the carrier plate 200 from the pedestal 140 to allow an end-effector or a spider fork mechanism to lift the carrier plate from the surface of the pedestal 140 or to lower the carrier plate on to the surface of the pedestal 140. The substrate processing system 100 further includes a gas supply manifold 112 that is connected to process gases 114, e.g., gas chemistry supplies from a facility. Depending on the processing being performed, the controller 110 controls the delivery of process gases 114 via the gas supply manifold 112. The chosen gases flow into the showerhead 150 and are distributed in a space volume defined between the face of the showerhead 150 that faces the wafer 101 and the top surface of the wafer 101 resting on the carrier plate that is received on the pedestal 140.

Further, the gases may be premixed or not. Appropriate valving and mass flow control mechanisms may be employed to ensure that the correct gases are delivered during the deposition and plasma treatment phases of the process. Process gases exit the chamber via an outlet. A vacuum pump (e.g., a one or two stage mechanical dry pump and/or a turbo-molecular pump) is used to draw process gases out and maintain a suitably low pressure within the reactor by a close loop controlled flow restriction device, such as a throttle valve or a pendulum valve.

Also shown is a carrier plate 200 that is received over the pedestal 140. The carrier plate 200 is configured to support and hold the wafer 101, when received. In some embodiments, the carrier plate 200 is a detachable unit that can be moved into and out of the process chamber. In such embodiments, the wafer is pre-loaded onto the carrier plate 200 outside of the process chamber and the carrier plate 200 with the loaded wafer is transported into the process chamber. The carrier plate 200 with the pre-loaded wafer 101 is received on the pedestal 140.

The carrier plate 200 includes a substrate support region 201 that is defined in a central region and extends a surface diameter of a top surface of the pedestal 140. In some embodiments, the surface diameter is equal to at least a diameter of the wafer that is being received on the carrier plate 200.

The pedestal 140 is connected to an electrostatic chuck (ESC) control (not shown). A voltage applied through the ESC control to the pedestal 140 enables generation of a clamping or a de-clamping force for clamping or de-clamping the carrier plate 200 to or from the top surface of the pedestal. In some embodiments, the voltage for clamping or de-clamping may be provided, in response to a signal provided by the controller 110. The controller 110 is also configured to control the lift pin mechanism so that the carrier plate may be lifted off the top surface of the pedestal, when the lift pins are activated.

Figure 1B:
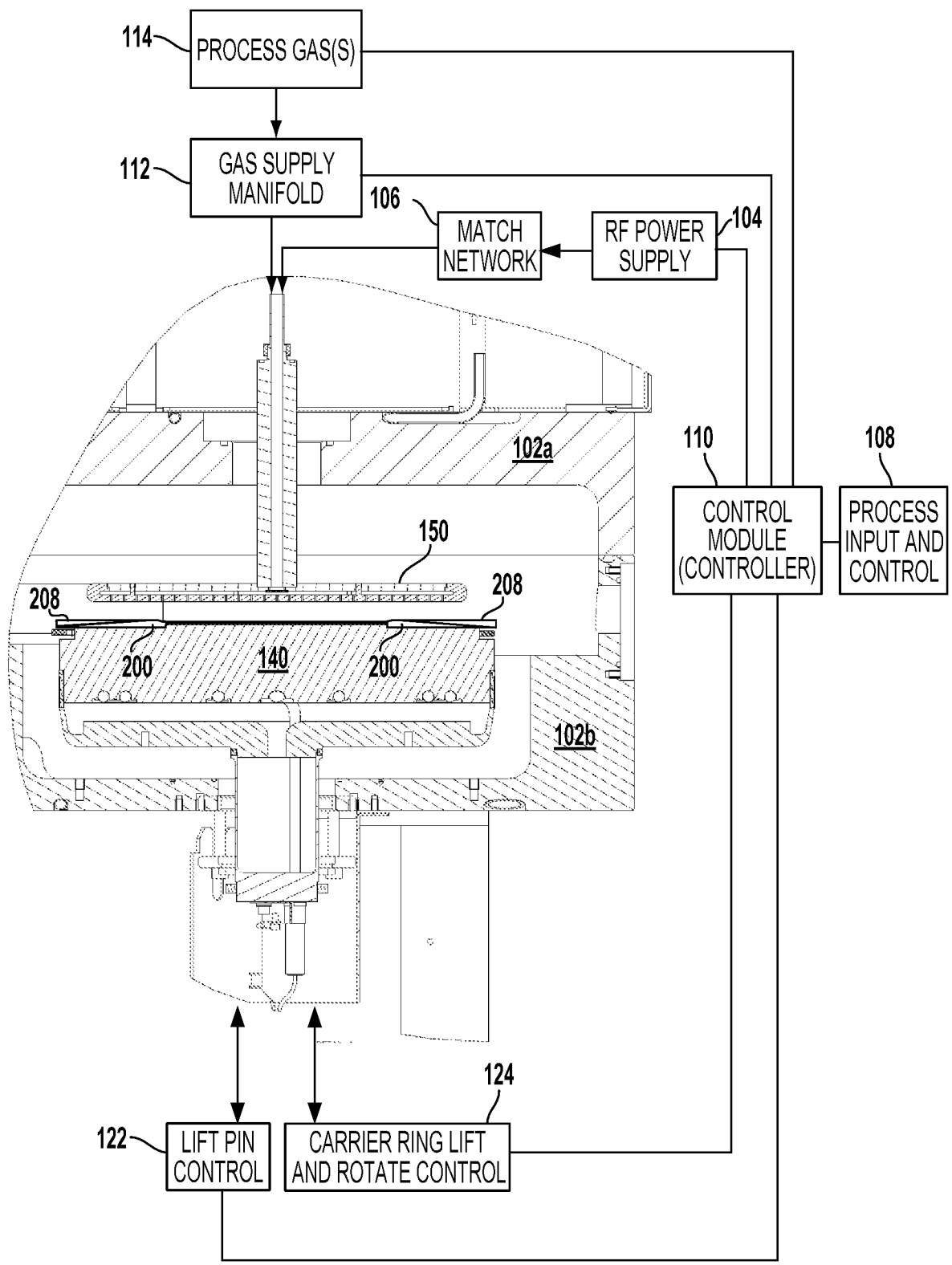
FIG. 1B illustrates a substrate processing system that is configured to perform a deposition process on a wafer, in accordance with one embodiment.

FIG. 1B illustrates an alternate example of a substrate processing system that is configured to be engaged within the process chamber. The components of the substrate processing system of FIG. 1B are similar to the substrate processing system illustrated in FIG. 1A, except that the power supply is electrically connected through the match network 106 to a showerhead 150, instead of the pedestal 140. Similar components in FIGS. 1A and 1B are numbered using the same reference numeral.

Figures 1, 1C:
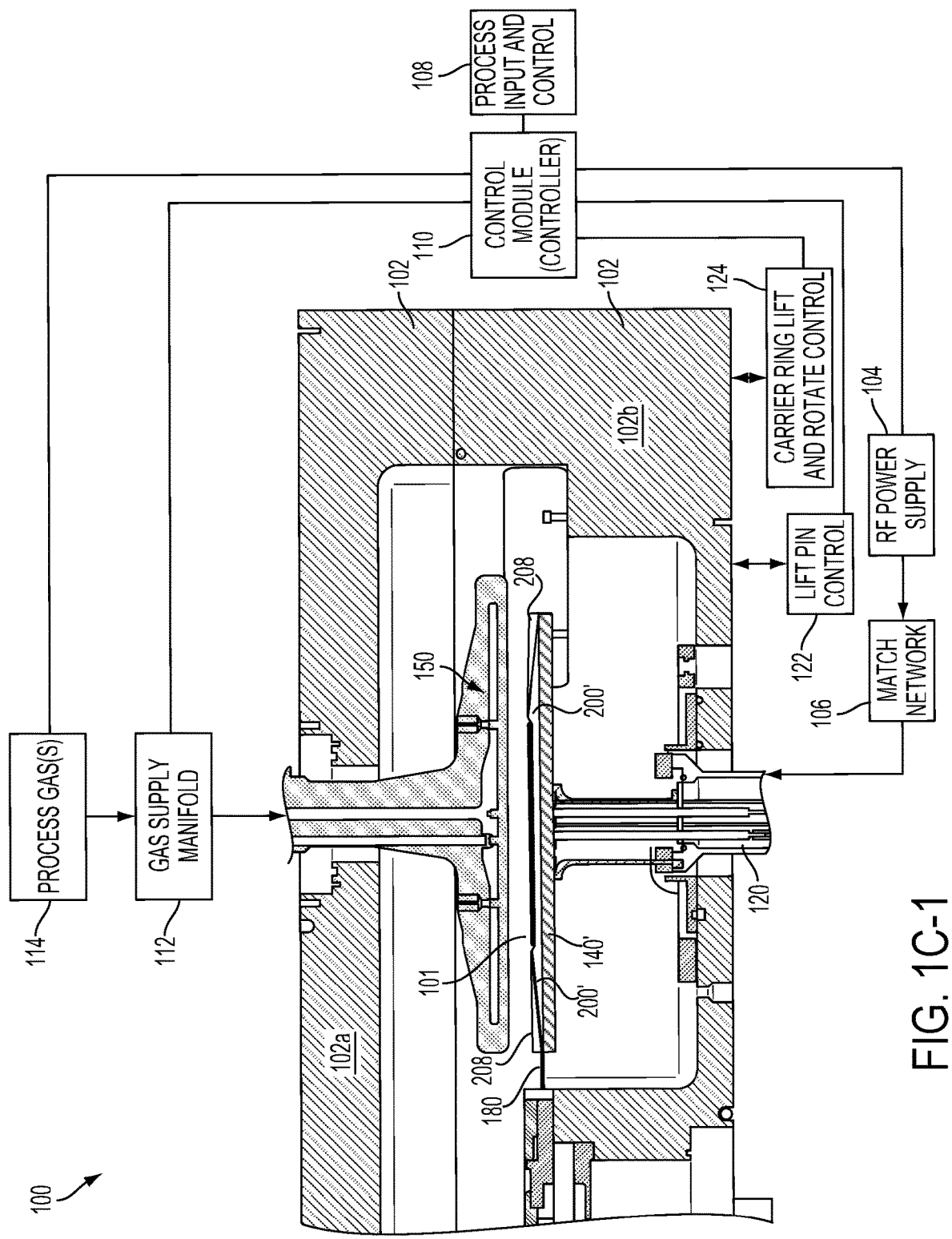
FIGS. 1C-1, 1C-2 and 1C-3 illustrate a substrate processing system, which is used to process a wafer, in accordance with an alternate embodiment.

FIG. 1C-1 illustrates an example of a substrate processing system 100 that is different from the example substrate processing system illustrated in FIG. 1A. Components that are common in FIGS. 1A and 1C-1 are numbered using the same reference numeral. It should be noted herein that the dimensions of the various components illustrated in the various Figures have been exaggerated in order to identify the components and are not true representation of the actual dimensions. The pedestal 140' of FIG. 1C-1 includes a top surface that extends an outer diameter. In this example, the pedestal 140' does not include an annular surface. The carrier plate 200' is received over the pedestal 140'. The geometry of a bottom surface of the carrier plate 200' is configured to match the geometry of the top surface of the pedestal 140'. A pocket is defined in the middle section of the carrier plate 200' to cover a surface diameter that is smaller than the outer diameter of the pedestal 140'. In one embodiment, the carrier plate 200' is received over the pedestal 140' by engaging a plurality of kinematic pins (not shown) disposed on the pedestal 140'. In some embodiments, three kinematic pins are distributed uniformly on the top surface of the pedestal 140' and used to align the carrier plate 200', when received over the pedestal 140'. The kinematic pins provide reliable contact support for the carrier plate 200'. It should be noted that the number of kinematic pins engaged is exemplary and that additional kinematic pins may be provided on the pedestal 140' for aligning the carrier plate 200' over the pedestal 140'. In such embodiments, the carrier supports may not be provided on the top surface of the pedestal 140' and the kinematic pins provide the MCAs to reliably support the carrier plate 200'.

FIGS. 1C-2 and 1C-3 illustrate an alternate embodiment wherein the carrier plate 200' is received over the pedestal 140' using a different alignment mechanism in place of the kinematic pins. In this embodiment, a groove-like feature 141 is defined on the top surface of the pedestal 140'. A bottom surface of the carrier plate 200' includes an extension 201 proximal to the outer perimeter of the carrier plate 200'. The extension 201 of the carrier plate 201' is sized to fit into the groove-like feature 141 of the pedestal 140'. In some embodiments, the outer diameter of the pedestal 140' is equal to the diameter of the carrier plate 200'. In such embodiments, the groove-like feature 141 is defined proximal to an outer perimeter of the pedestal 140' such that diameter of the extension 201 of the carrier plate 200' is equal to the diameter of the groove-like feature 141. In other embodiments, the diameter of the pedestal 140' may be greater than the diameter of the carrier plate 200'. In such embodiments, the groove-like feature of the pedestal may be defined at an appropriate distance from the outer perimeter of the pedestal 140' such that the diameter of the groove-like feature equals the diameter of the extension 201 defined on the carrier plate 200'. The carrier plate 200' is supported by the groove-like feature 141 and no carrier supports are provided on the top surface of the pedestal 140'. The top surface of the pedestal 140' and the bottom surface of the carrier plate have a similar geometrical profile.

Figures 1, 1C, 2:
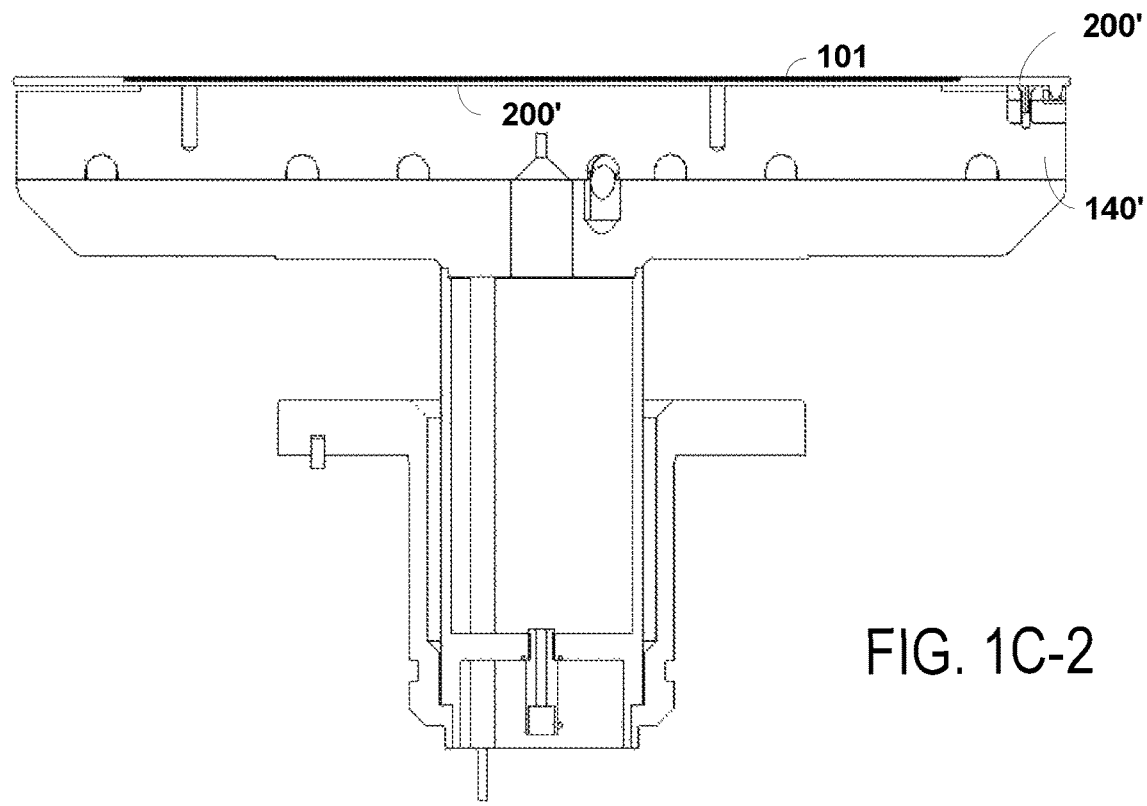
Figures 1, 1C, 2, 3:
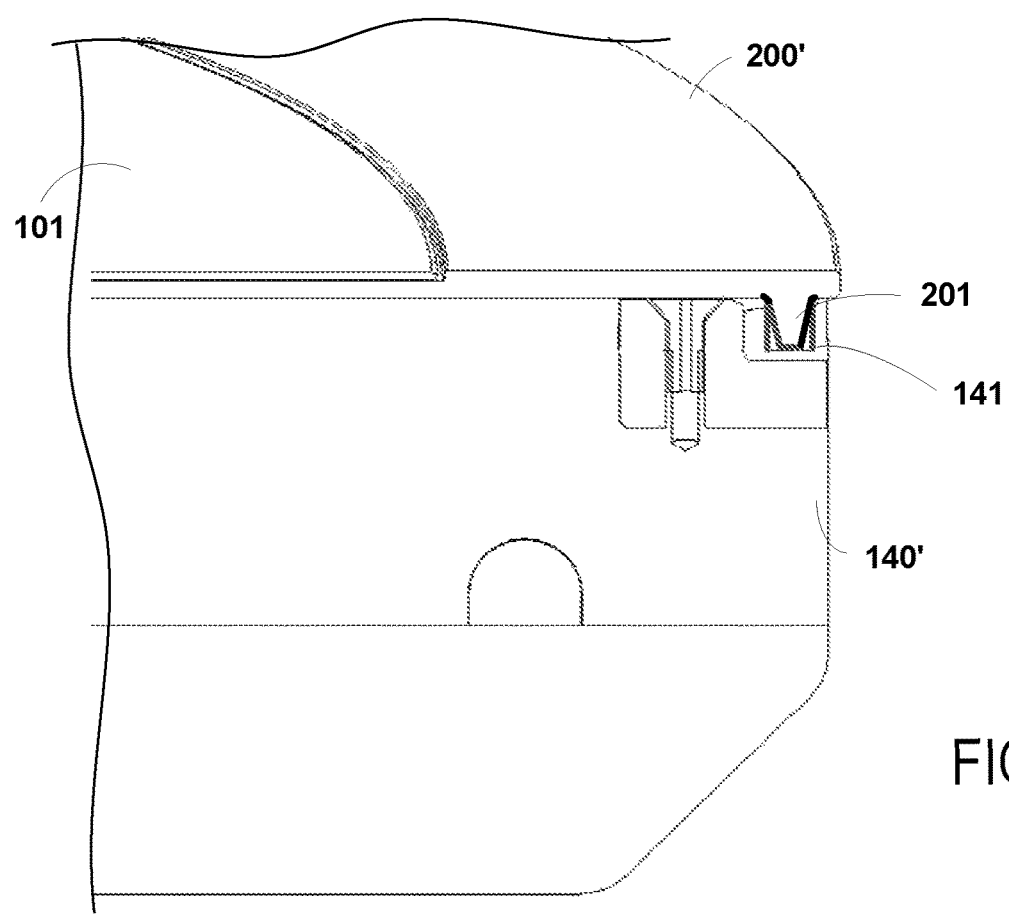
Figure 1D:
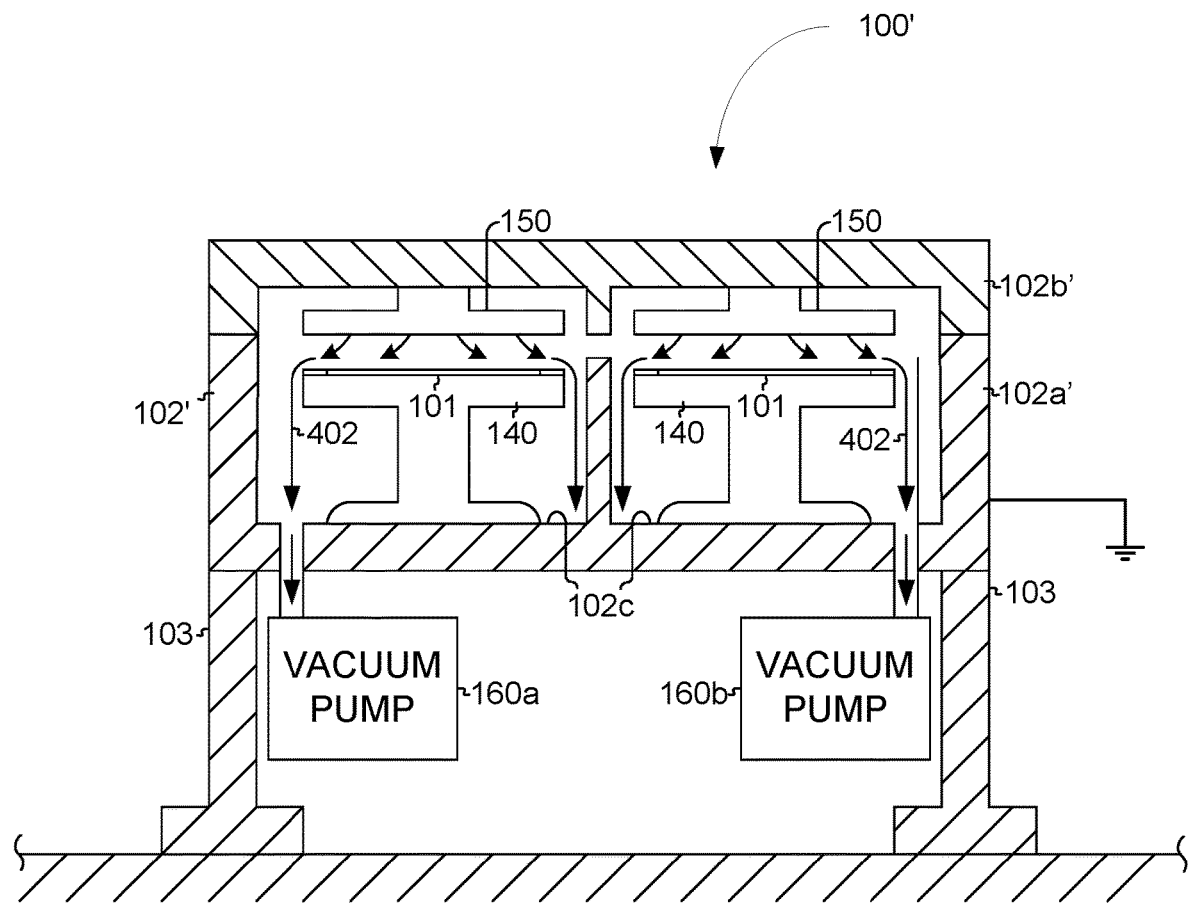
FIG. 1D illustrates a cross-section view of a multi-station chamber of a substrate processing system that is configured to perform a deposition process on a wafer, in accordance with one embodiment.

FIG. 1D illustrates a cross-sectional view of a substrate processing system 100' that engages multiple stations, in accordance with one embodiment. The process chamber 102' includes a lower chamber portion 102b' that houses multiple stations and an upper chamber portion 102a' that houses multiple showerheads 150. The number of showerheads 150 in the upper chamber portion 102a' equals the number of stations disposed in the lower chamber portion 102b'. The upper chamber portion 102a' is configured to lower the showerheads 150, such that the showerheads 150 are substantially aligned over the pedestal 140 of each station. The lower chamber portion 102b' is configured to be supported by a support structure 103. The support structure 103 may be defined by any suitable structure capable of supporting the multi-station process chamber 102', as well as facilities utilized to provide gases, RF power, pressure control, temperature control, timing, and associated controller and electronics. In one embodiment, the support structure 103 is defined from a metal tubular structure, which supports the process chamber 102' above a surface (e.g., clean room floor) in which the process chamber 102' of the substrate processing system 100' is installed. Vacuum pumps 160a, 160b are provided and interfaced with the lower chamber portion 102b'. The vacuum pumps 160a, 160b, are configured to provide for sufficient gas flow, remove process gases and/or provide pressure controls within the process chamber 102'. Typically, the process gases are allowed to flow over the substrate 101 and over the edges of the carrier plates 200 toward the vacuum pumps 160a, 160b, thus defining gas flow paths 402.

Figure 2B:
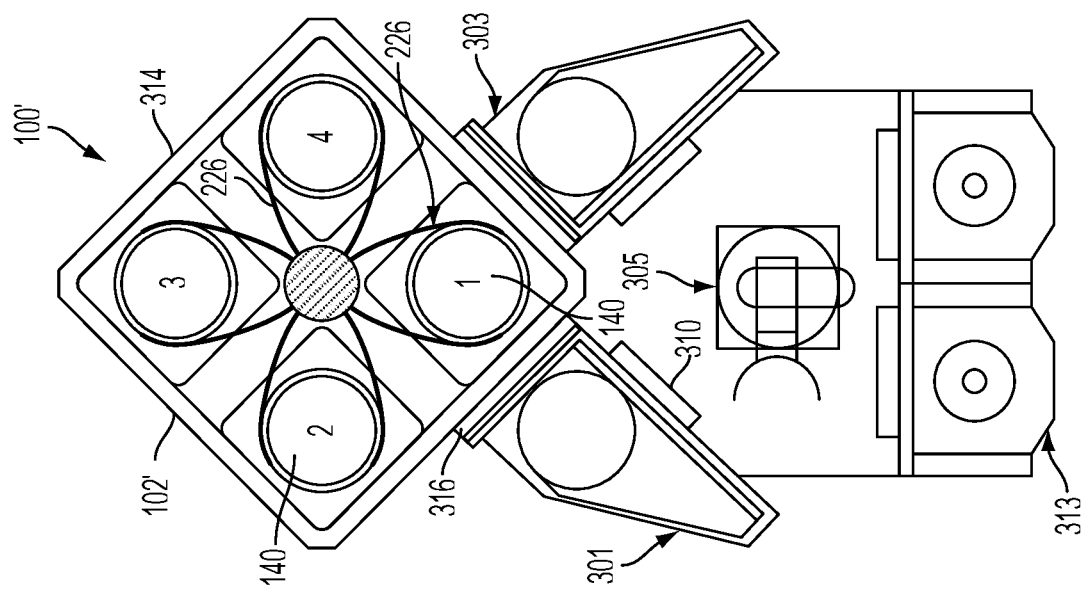
FIG. 2B shows a schematic view of an embodiment of a multi-station processing tool of a substrate processing system illustrated in FIG. 2A with an inbound load lock and an outbound load lock, in accordance with one embodiment.
Figure 2A:
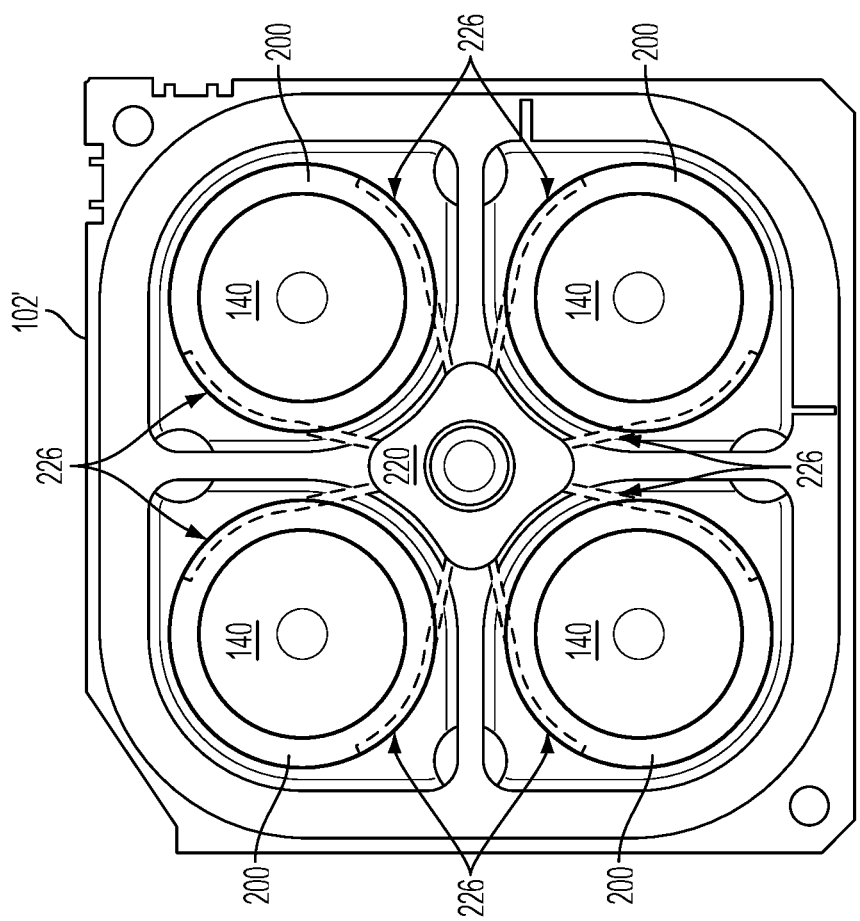
FIG. 2A illustrates a top view of a multi-station processing tool of a substrate processing system, wherein four processing stations are provided and a spider fork is used to move the carrier plate, in accordance with one embodiment.
Figure 3:
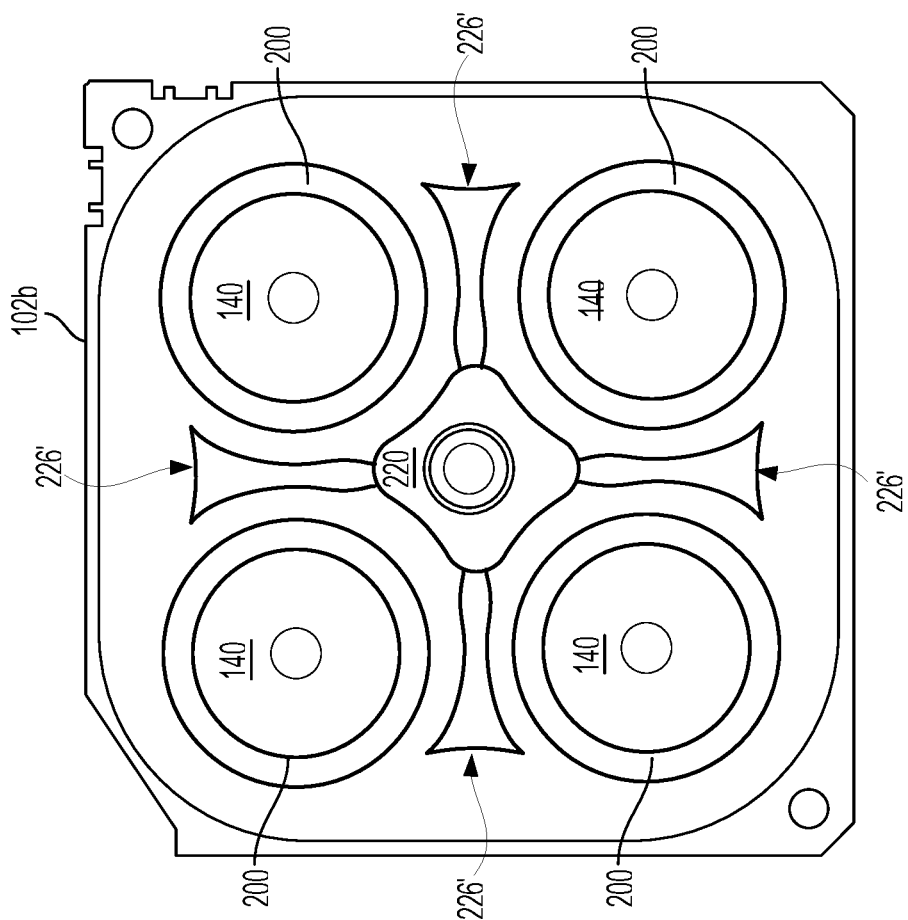

FIG. 2A illustrates a top view of a multi-station substrate processing system 100', wherein four processing stations are provided in a process chamber 102'. This top view is of the lower chamber portion 102b' (e.g., with the upper chamber portion 102a' removed for illustration) of the process chamber 102'. The four stations are accessed by a lifting mechanism 226 that engages spider forks, in one embodiment. Each spider fork includes a first and second arm, each of which is positioned around a portion of each side of the pedestal 140. In this view, the spider forks are drawn in dash-lines, to convey that they are below the carrier plates 200. The spider forks are coupled to a rotating mechanism 220. Although the reference numeral 226 is pointing to the spider forks, it is to be noted that the spider forks and the rotating mechanism 220 are part of the lifting mechanism 226. The spider forks, when engaged, are configured to move under an outer edge of the carrier plates 200 and lift the carrier plates 200 (i.e., from a lower surface of the carrier plates 200) from the stations simultaneously, and then rotate at least one or more stations before lowering the carrier plates 200 (where at least one of the carrier plates supports a wafer 101) to a next location so that further plasma processing, treatment and/or film deposition can take place on respective wafers 101.

FIG. 2B shows a schematic view of an embodiment of a multi-station substrate processing system 100' with an inbound load lock 301 and an outbound load lock 303. A robot 305, at atmospheric pressure, is configured to move wafers from a cassette loaded through a pod 313 into inbound load lock 301 via an atmospheric port 310. Inbound load lock 301 is coupled to a vacuum source (not shown) so that, when atmospheric port 310 is closed, inbound load lock 301 may be pumped down. Inbound load lock 301 also includes a chamber transport port 316 interfaced with process chamber 102'. Thus, when chamber transport 316 is opened, another robot (not shown) may move a wafer from inbound load lock 301 to a pedestal 140 of a first process station disposed in the lower chamber portion 102b', for processing.

The depicted process chamber 102' comprises four process stations, numbered from 1 to 4 in the embodiment shown in FIG. 2B. In some embodiments, process chamber 102' may be configured to maintain a low pressure environment so that wafers may be transferred using a carrier plate 200 among the process stations without experiencing a vacuum break and/or air exposure. Each process station depicted in FIG. 2B includes a pedestal 140 to receive a carrier plate with the wafer and process gas delivery line inlets (not shown).

FIG. 2B also depicts spider forks of the lifting mechanism 226 for transferring substrates within process chamber 102'. As will be described in more detail below, the spider forks rotate and enable transfer of wafers from one station to another. The transfer occurs by enabling the spider forks to move under an outer undersurface of the carrier plates 200 and lifting the carrier plates 200 with the wafer 101. The carrier plates with the wafer 101 are moved to the next pedestal 140. In one configuration, the spider forks are made from a ceramic material to withstand high levels of heat during processing.

In the configuration of FIGS. 2A and 2B, no grounding plate is provided around each of the pedestals. As such, the lower chamber body is left exposed and the RF ground return is usually via chamber walls. This configuration does not provide any symmetry for RF ground return. In an alternate embodiment, a grounding plate may be included to provide symmetric RF ground return.

FIG. 3 illustrates an alternate embodiment of the lifting mechanism illustrated in FIG. 2A. A lifting mechanism 226' includes wafer blades instead of the spider forks. The wafer blades of the lifting mechanism 226' are attached to the rotating mechanism 220. Although the reference numeral 226' in FIG. 3 is pointing to spider forks, it is to be noted that the spider forks and the rotating mechanism 220 are part of a lifting mechanism 226' that is employed in the process chamber 102' for lifting the carrier plates 200. In some embodiments, the rotating mechanism 220 is a spindle that is operated by a spindle motor (not shown).

When the carrier plates 200 have to be moved, the lift pins are engaged using the lift pin control. The lift pins lift the carrier plates 200 with the wafer from the pedestal 140. The wafer blades move under the carrier plates 200 and lift the carrier plates 200 off of the lift pins. The lift pins retract into the housing, and the spindle and the wafer blades rotate the carrier plates 200 to the next pedestal 140. The lift pins are once again engaged to receive the carrier plates 200 off the wafer blades. The wafer blades and the spindle are rotated out of the way and the carrier plates 200 are received on the pedestal 140. The transferring of the carrier plates 200 with the wafer are coordinated so that the carrier plates 200 with the wafer are positioned on different pedestals to allow further processing of the wafer. In the embodiment illustrated in FIG. 3, the lift pins are strategically disposed in a body of the pedestal so as to not hinder with the movement of the wafer blades, when the lift pins are engaged.

Figure 4:
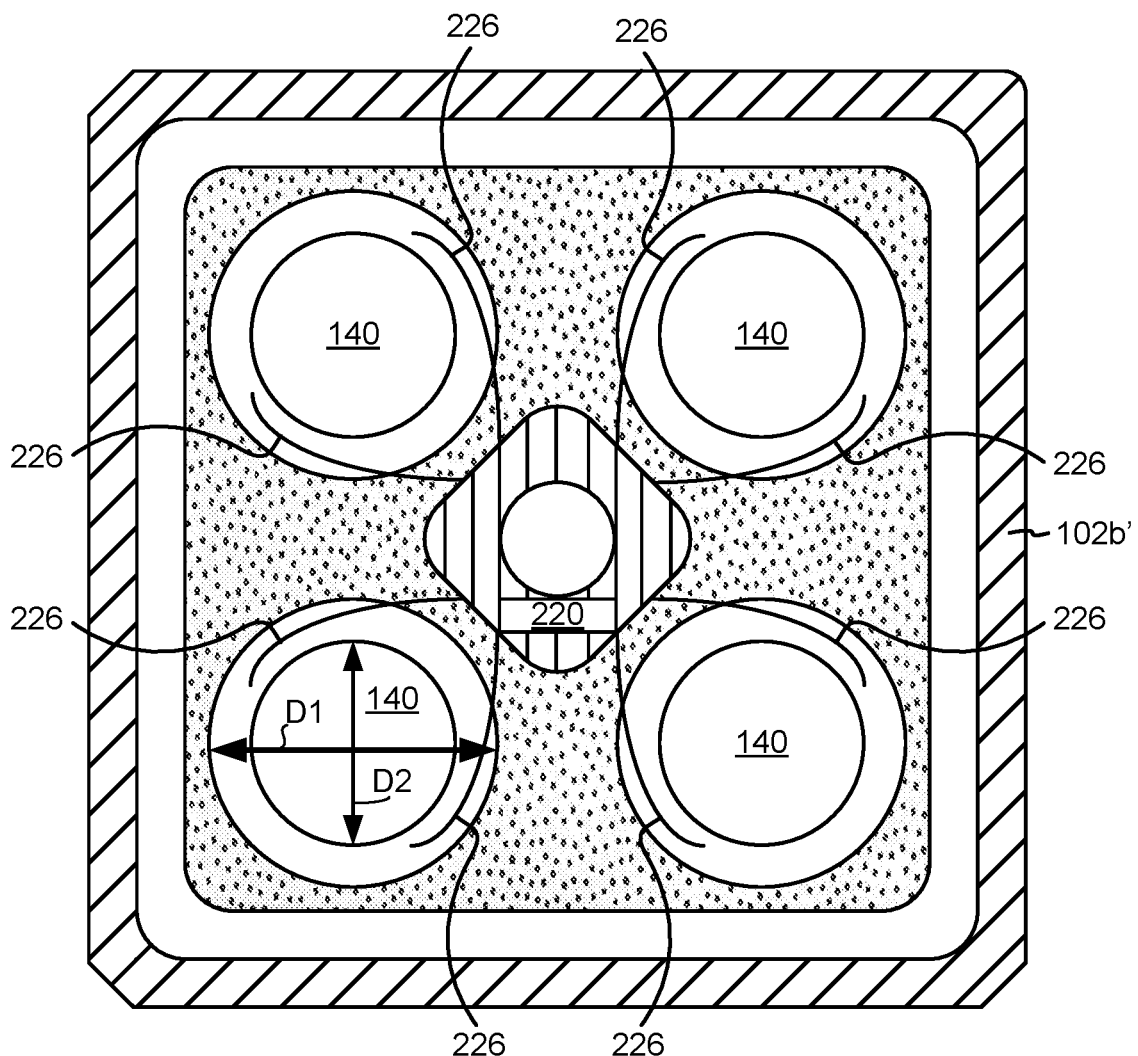
FIGS. 4 illustrates a top view of an example configuration of the processing stations of a multi-station processing tool, in accordance with one embodiment.

FIG. 4 is a top view of a lower chamber portion 102b', which illustrates the positioning of pedestals 140 of different stations. As shown, the pedestals 140 are disposed in process openings defined on a surface disposed in the lower chamber portion 102b'. The pedestals 140 are configured to receive carrier plates 200. In some embodiments, a diameter of the carrier plate 200 received on the pedestal 140 is equal to an outer diameter of the pedestal 140, which is less than diameter of the process openings.

A geometric profile of a bottom surface of the carrier plates 200, in some embodiments, matches with a geometric profile of a top of the pedestal 140 so that the carrier plates 200, when received, may sit on the pedestal 140. In some embodiments, a pocket is defined in a middle section on a top surface of the carrier plate 200 and extends a surface diameter. The surface diameter D2 of the pocket is sized to accommodate a width of the wafer 101 that is received on the carrier plates 200 for processing. For more information on the size of the surface diameter of the pocket, reference can be made to application Ser. No. 14/578,126, filed on Dec. 19, 2014, and entitled "Reducing Backside Deposition at Wafer Edge," which is incorporated herein by reference in its entirety. A gap exists between each of the pedestals, carrier plates and the outer edge of the process openings. The gap provides sufficient space for air flow/process gas flow. It should be understood that the dimension of the gap will be scaled in accordance to the size of the pedestals and the carrier plates used. for systems that accommodate larger or smaller wafers, the example dimensions will scale accordingly.

In some embodiments, the surface of the lower chamber portion 102b' may be configured to provide symmetric ground potential around the process openings defined by diameter D1, such that a return path to ground is defined for the RF power. This improves process uniformities as well as achieves more stringent control of deposition films.

The surface of the lower chamber portion 102b' also includes a center opening that is used to accommodate the rotating mechanism 220 of the lifting mechanism 226 or 226', in some embodiments. The rotating mechanism 220 is coupled to spider forks. Although spider forks are shown to be attached to the rotating mechanism 220, other embodiments may engage wafer blades instead of the spider forks. In the embodiments, where the lifting mechanisms 226, 226', engage spider forks or wafer blades, the lifting mechanisms are configured to move radially. In yet other embodiments, instead of the lifting mechanism with spider forks or wafer blades, other lifting mechanisms may be used, which may or may not include a rotating mechanism 220. In the embodiments where different lifting mechanisms 226 are provided in the process chamber 102', the lifting mechanism(s) may be disposed on a side of the corresponding pedestals. In such embodiments, the lifting mechanism(s) may be configured to move vertically as well as radially in order to lift and move the carrier plates 200. Irrespective of the type of lifting mechanisms used, the lifting mechanisms 226 are connected to a controller 110. The controller 110 provides necessary signals to activate the lift pins and the lifting mechanisms at the process stations when the carrier plates 200 with the wafer(s) have to be moved. With the overview of the substrate processing system, the details of the carrier plate used in the substrate processing system will now be described with reference to FIGS. 5A-5F-2.

Figures 1, 5A:
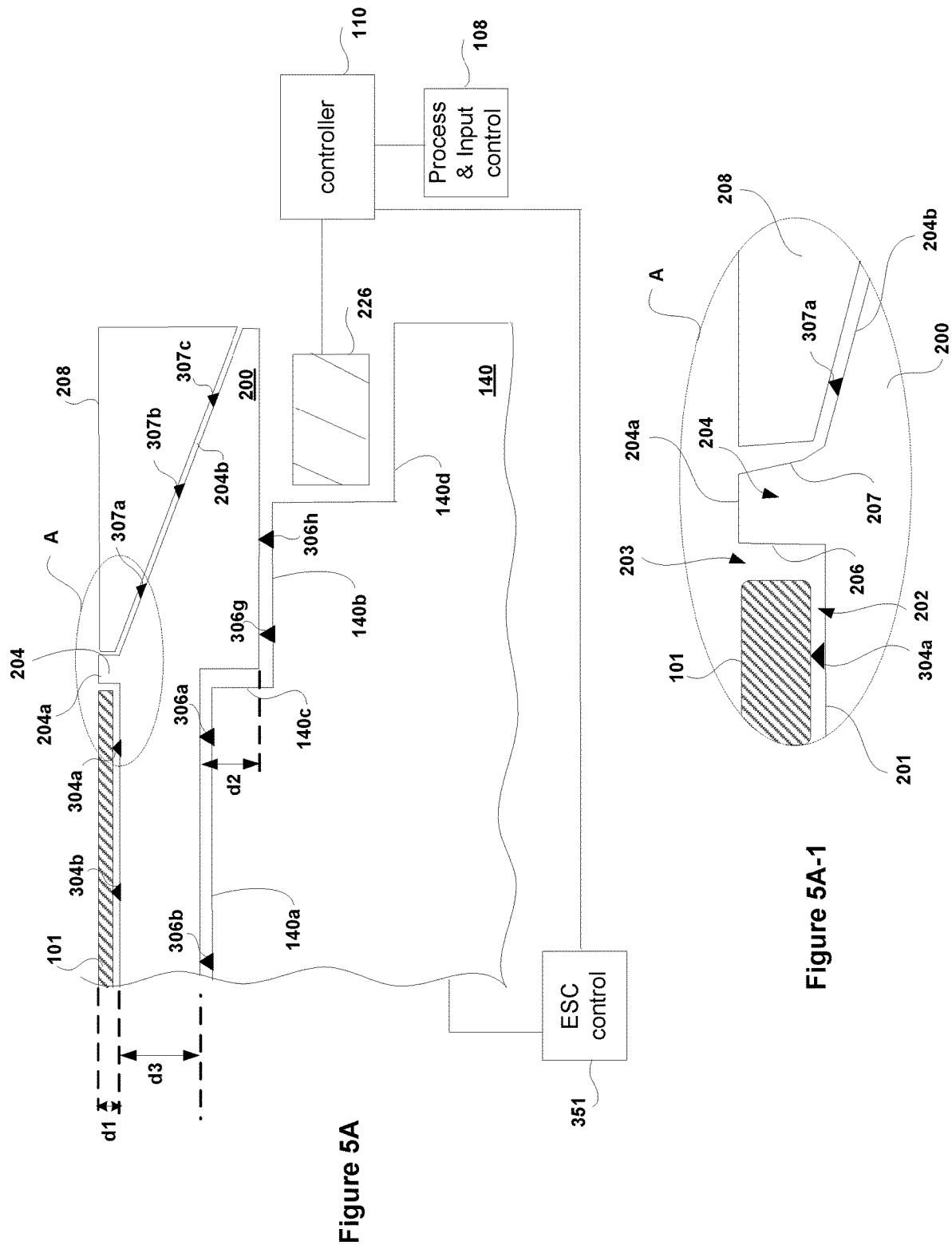
FIG. 5A illustrates a cross-section view of a peripheral portion of a pedestal 300 on which a carrier plate is received in the substrate processing system, in accordance with an embodiment of the invention.

FIG. 5A illustrates an example cross-section view of a pedestal 140 on which a carrier plate 200 is received within a process chamber 102. The pedestal 140 includes a top surface 140a and an annular surface 140b. The top surface 140a is defined in a middle section of the pedestal 140 and extends from a central axis to cover a surface diameter. The annular surface 140b is defined a step 140c down from an outer edge of the top surface 140a, such that the vertical position of the top surface 140a is higher than the vertical position of the annular surface 140b. In one embodiment, the annular surface 140b extends toward an outer diameter of the pedestal 140. In some embodiments, an outer diameter of the annular surface 140b may be less than an outer diameter of the pedestal 140. In such embodiments, additional step(s) may be defined in the pedestal 140 to separate the annular surface 140b from a second annular surface 140d of the pedestal 140. In other embodiments, the outer diameter of the annular surface 140b may extend to the outer diameter of the pedestal 140. The step 140c separating the top surface 140a and the annular surface 140b of the pedestal 140, is defined by a step height. In some embodiments, the step height is between about 3 mm and about 6 mm. In other embodiments, the step height is about 4 mm. The carrier plate 200 is configured to sit over the top surface 140a of the pedestal 140, when received in the process chamber 102. In some embodiments, a plurality of carrier supports may be disposed over the top surface 140a of the pedestal 140 on which the carrier plate 200 is received.

In some embodiments, a bottom surface of the carrier plate may have a surface profile that enables the carrier plate to sit on the pedestal 140. For example, the bottom surface may include a central portion, a vertical portion and a horizontal portion. The central portion is defined in a center of the carrier plate. The vertical portion is defined downward from an outer edge of the central portion to an inner edge of the horizontal portion. The height of the vertical portion, in this embodiment, is defined by a second height 'd2'. The second height d2 is equal to the height of the step 140c of the pedestal 140. An additional step may be defined in the pedestal 140 to separate the annular surface 140b from a second annular surface 140d. In one embodiment, the step 140c, additional step (where available) define a recess into which a lifting mechanism, such as a spider fork 226, is disposed. The spider fork 226 is used to support and move the carrier plate 200, when engaged.

In some embodiments, the carrier plate 200 includes a pocket 202 defined in a middle section on a top surface of the carrier plate 200. The pocket 202 defines a substrate support region 201 that is configured to cover at least a surface diameter of a top portion of the pedestal 140. In one embodiment, the surface diameter of the pocket is defined to cover at least a surface diameter of a wafer that is received thereon. The surface diameter of the wafer may be one of 100 mm wafer, a 150 mm wafer, a 200 mm wafer, a 330 mm wafer, and a 450 mm wafer. Of course, the diameters of the wafer that is provided herein are just examples and other sizes of wafer may be received into appropriately sized pocket 202.

The carrier plate 200 also includes a retaining feature 204 that is disposed adjacent to an outer edge of the pocket 202. A top surface 204a of the retaining feature is adjacent to the pocket. A step 206 defining the wall of the pocket 202 separates the top surface 204a of the retaining feature 204 from the substrate support region 201 of the carrier plate 200. The step 206 extends upward to a first height 'd1' so that the horizontal surface of the substrate support region 201 is lower than the horizontal surface of the top surface 204a of the retaining feature 204. In some embodiment, the first height is designed to be greater than a thickness of the wafer that is received on the substrate support region 201 of the pocket 202. A tapered portion 204b of the carrier plate 200 is disposed adjacent to the retaining feature 204 and extends from the retaining feature 204 to an outer diameter of the pedestal 140. The tapered portion 204b is configured to receive a focus ring 208.

In some embodiments, the top surface 140a of the pedestal 140 includes a plurality of carrier supports 306a, 306b, etc., to support the carrier plate 200 at a support level above the top surface 140a of the pedestal 140. In some embodiments, the carrier supports 306 are positioned at or along the edge of the top surface 140a of the pedestal 140. In other embodiments, the carrier supports 306 are distributed uniformly about the top surface 140a of the pedestal 140 so that the carrier plate 200 may rest reliably. In some embodiments, additional carrier supports 306g, 306h, may be defined at the annular surface 140b of the pedestal 140 so as to support a bottom portion of the carrier plate 200. In alternate embodiments, no carrier supports are defined on the annular surface 140b. In such embodiments, a bottom portion of the carrier plate 200 rests directly on the annular surface 140b. This design may be implemented in order to avoid any gaps between the carrier plate 200 and the annular surface 140b so that any plasma or other precursors present in the process chamber are prevented from accessing the underside of the carrier plate 200.

A plurality of wafer supports 304a, 304b, etc., is distributed uniformly along a top surface of the substrate support region 201 defined in the pocket 202 of the carrier plate 200 so as to provide reliable support for the wafer 101, when received in the pocket 202 of the carrier plate 200. The height of the wafer supports 304 in the pocket 202 and the depth of the pocket 202 are defined such that the wafer 101, when received in the pocket 202, is flush with a top surface of the carrier plate 200 (i.e., top surface of the retaining feature 204). In some embodiments, the depth of the pocket 202 may be equal to the combined height of the wafer supports 304 on the substrate support region 201 and the thickness of the wafer 101. In some embodiments, when the wafer 101 is supported on the wafer supports 304 within the pocket 202 of the carrier plate 200, a gap 203 may be present between an edge of the wafer 101 and an inner edge of the retaining feature 204 of the carrier plate 200. The gap 203, in some embodiments, can be controlled so that the top surface 204a of the retaining feature 204 provides a substantially planar surface that extends from the top surface of the wafer 101, when the wafer 101 is received in the pocket 202. It should be noted that a size of the pocket 202 defined on the carrier plate 200 is sized in accordance to the diameter of the wafer 101 received therein. For example, for a 300 mm wafer received in the pocket 202 of the carrier plate 200, the pocket 202 is sized so that the gap 203 is between about 0.2 mm to about 1 mm.

In some embodiments, a thickness of the carrier plate 'd3' at the substrate support region 201 (i.e., portion of the carrier plate 200 in the pocket 202) is based on the material used and overall weight of the carrier plate 200. Additionally, the thickness d3 of the carrier plate at the substrate support region 201 may depend on the top surface profile of the substrate support region 201 defined in the pocket 202. In some embodiments, the thickness d3 of the carrier plate at the substrate support region 201 defined in the pocket 202 is between about 0.5 mm to about 5 mm. In some embodiments, when the top surface of the substrate support region 201 within the pocket 202 has a uniform flat surface profile, the thickness d3 of the carrier plate at the substrate support region 201 may be between about 1 mm to about 1.5 mm. In some other embodiments, when the top surface of the substrate support region 201 within the pocket 202 has a ribbed surface profile, the thickness d3 of the carrier plate at the substrate support region 201 in the pocket 202 may be between about 1 mm to about 3 mm. In some embodiments, the substrate support region 201 is made of ceramic material.

In some embodiments, the edge and the top surface 204a of the retaining feature 204 as well as the tapered portion 204b of the carrier plate 200 may adapt varied geometrical profile. In one embodiment illustrated in FIG. 5A, the retaining feature 204 is designed to have top surface 204a immediately adjacent to the step 206 that separates the substrate support region 201 in the pocket 202 from the retaining feature 204. A second step 207 is defined on a side that is opposite to the step 206 and a tapered portion 204b extends from a bottom edge of the second step 207 outward to the outer diameter of the pedestal 140 so as to define a wedge-shaped profile. It should be noted that the retaining feature 204 and the tapered portion 204b may adapt alternate geometrical profiles including the examples shown in FIGS. 5B and 5C.

FIG. 5A-1 illustrates an expanded view of an edge of the pocket 202 in which the wafer 101 is received. The wafer 101 is received on the wafer supports 304a, etc., defined in the substrate support region 201 of the pocket 202, which provides reliable contact area for the wafer 101.

Continuing with FIG. 5A, wafer supports 304a, 304b, etc., are shown to be distributed on the top surface of the substrate support region 201. In some embodiments, the wafer supports 304a, 304b, etc., are distributed symmetrically about a peripheral portion of the top surface of the substrate support region 201. In other embodiments, any number of wafer supports may be distributed on the top surface of the substrate support region 201, and these wafer supports 304 may be distributed about the top surface of the substrate support region 201 in any suitable configuration for supporting the wafer during deposition process operations. In some embodiments, the wafer supports 304a, 304b, etc., are fabricated directly into the carrier plate, as small bumps. The small bumps define minimal contact areas (MCAs) that provide continuous contact for the wafer 101, when received. MCAs are used to improve precision mating between the wafer surface and the top surface of the substrate support region 201 of the carrier plate 200 when high precision or tolerances are required, and/or minimal physical contact is desirable to reduce defect risk.

In some embodiment, it is possible to fabricate high precision wafer supports with smaller dimensions when they are fabricated as part of a single component. For example, precision wafer supports may be fabricated directly on a top surface of the substrate support region 201 of the pocket 202 whose sides and bottom are continuous. In one embodiment, the carrier plate 200 may be fabricated out of a different material than the pedestal 140. For example, the carrier plate 200 may be fabricated out of ceramic material while the pedestal 140 may be made of metal, such as aluminum.

In one embodiment, the carrier plate 200 may be fabricated out of non-silicon containing material. In one embodiment, the non-silicon containing material may include aluminum oxide, etc. In another embodiment, the carrier plate 200 may be fabricated out of high thermal conductivity material, such as aluminum nitride, silicon, etc. In some other embodiment, the carrier plate 200 may be fabricated out of aluminum oxide. The aforementioned materials are provided as examples and should not be construed as an exhaustive list. In some embodiments, the pedestal 140 may be made of dielectric material. The hybrid pedestal-carrier plate provides a low cost solution for moving the wafer 101 from one process station or chamber to another process station or chamber without having to make or break contact to effect wafer movement. The design of the carrier plate 200 eliminates gaps under the edge of the wafer 101, when the wafer 101 is present. MCAs are not restricted to the carrier plate area but can be included in other areas of the carrier plate 200, such as on a top surface of the tapered portion 204b.

In one embodiment, the focus ring 208 is received over the tapered portion 204b of the carrier plate 200 to extend the deposition surface of the wafer 101 received on the carrier plate 200. Further, the focus ring 208 protects the tapered portion 204b of the carrier plate 200 from getting exposed to the chemicals used in the process chamber. In some embodiments, a dielectric constant of the focus ring is less than a dielectric constant of the carrier plate 200. The focus ring 208 is received on the tapered portion 204b. The focus ring extends from a recess defined by the step 207 to the outer diameter of the carrier plate 200. In some embodiments, a geometrical profile of the focus ring 208 matches the geometrical profile of the tapered portion 204b. For example, in the embodiment illustrated in FIG. 5A, the tapered portion 204b is shown to have a wedge-shape profile. A broader side of the tapered portion 204b is disposed adjacent to the step 140c of the pedestal 140 and the narrow side of the tapered portion 204b is disposed facing the outer side of the pedestal 140. The focus ring 208 that is received over a top surface of the tapered portion 204b of the carrier plate 200, in this embodiment, is also shown to have a wedge-shaped profile. The focus ring 208 is disposed over the tapered portion 204b such that narrow side of the focus ring 208 is facing inward and the broader side of the focus ring 208 facing outward. This arrangement causes the top surface of the focus ring 208 received on the carrier plate 200 to be sufficiently flush with the top surface of the wafer 101, when received. The focus ring 208, in one embodiment, is configured to have tailored impedance to contain the plasma during deposition process. For more information on impedance management, reference can be made to application Ser. No. 15/077,844, filed on Mar. 22, 2016, and entitled, "Asymmetric Pedestal/Carrier Ring Arrangement for Edge Impedance Modulation," which is incorporated herein by reference in its entirety.

In one embodiment, the pedestal 140 is designed to function as an electrostatic chuck (ESC). In such an embodiment, an ESC control 351 may be coupled to the pedestal 140 to provide the necessary voltage to a plurality of electrodes defined in a body of the pedestal 140 so as to enable ESC clamping. In one embodiment, the ESC control 351 is configured to provide voltage to induce bipolar clamping. The details of the ESC control 351 will be described in more detail with reference to FIG. 5E. The ESC control 351 may include a power source to provide the appropriate voltage for clamping or de-clamping, and may be connected to a controller 110. The controller 110 is configured to generate a first signal to the ESC control 351 to cause a clamping voltage to be applied to the pedestal 140 when the carrier plate 200 is received over the pedestal 140 and a second signal to cause a reverse voltage to be applied to the pedestal 140 when the carrier plate 200 needs to be de-clamped from the pedestal 140.

The controller 110 is configured to receive process recipes by executing the process input and control 108 and provide appropriate signals to various components of the process chamber 102 in accordance to the process recipes. A lifting mechanism, such as a spider fork 226, may be provided on one or more sides of the pedestal 140. The lifting mechanism is configured to lift or lower the carrier plate 200 from or on to the pedestal 140, when engaged. The spider fork 226 is connected to the controller 110 so that the controller 110 can provide the appropriate signal to activate the spider fork 226. In some embodiments, the spider fork 226 may be additionally configured to move the carrier plate 200 from one process station to another process station within the process chamber, such as in a quad surface mount process chamber. The spider fork 226 is one form of a lifting mechanism used in lifting the carrier plate 200 from the pedestal 140 and that other mechanisms may also be employed.

One or more recesses are provided on the top surface of the pedestal 140. The recesses are configured to allow the lift pins to extend outward from their respective housing, when the lift pins are activated. A plurality of lift pins are distributed in a body of the pedestal 140. The lift pins are part of a lift pin mechanism that can be utilized to raise the carrier plate 200 resting on the carrier supports 306 so that the carrier plate 200 may be lifted and moved by the spider fork 226. The lift pins are activated using a lift pin control (not shown) that is coupled to the controller 110. A signal is provided by the controller 110 to activate or de-activate the lift pin control.

In some embodiments, a bottom surface of the carrier plate 200 has a geometrical profile that allows the carrier plate to sit on the pedestal 140. For example, the bottom surface of the carrier plate may include a central portion, a vertical portion and a horizontal portion. The central portion is defined in a center of the carrier plate extending at least the surface diameter of the pocket. The vertical portion is defined downward from an outer edge of the central portion to an inner edge of the horizontal portion. The height of the vertical portion, in this embodiment, is defined by a second height 'd2'. The second height d2 is equal to the height of the step 140c, when received on the pedestal 140. In one embodiment additional step may be defined in the pedestal 140. For example, an additional step may separate a second annular surface 140d from the annular surface 140b such that the vertical position of the annular surface 140b is higher than the vertical position of the second annular surface 140d. The step 140c and the additional step (if any) define a recess into which a fork mechanism, such as a spider fork 226 is disposed. The spider fork 226 is used to lift the carrier plate 200, when engaged.

Figure 5B:
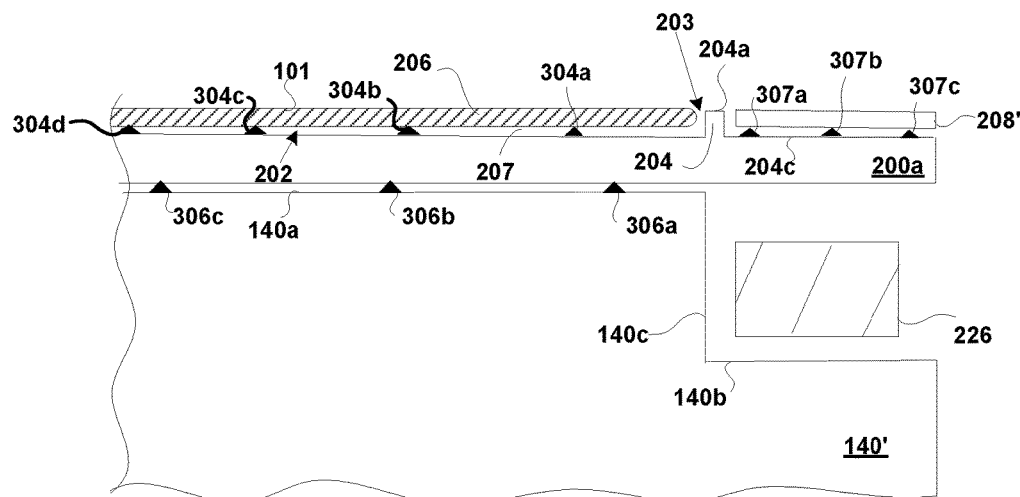
FIG. 5B illustrates a cross-section view of a peripheral portion of the wafer, including a carrier plate that is used for receiving a focus ring, in accordance with an alternate embodiment of the invention.

FIG. 5B illustrates a view of the peripheral portion of the pedestal 140' on which the carrier plate 200a is received, in one embodiment. The geometric profile of the pedestal 140' is different from the geometric profile of the pedestal 140 discussed with reference to FIG. 5A. In this embodiment, the step 140c separating the top surface from the annular surface 140b of the pedestal defines a recess area in which a spider fork 226 is disposed. The geometric profile of the carrier plate 200a is also different from the carrier plate 200 defined with reference to FIG. 5A. As illustrated, the retaining feature 204 includes a top surface 204a adjacent to a step 206 of the pocket 202 and an extension 204c of the retaining feature is defined adjacent to the retaining feature 204 on a side away from the pocket 202. The step 206 has a rectangular profile.

The geometric profile of the carrier plate 200a is substantially rectangular with a raised top surface 204a. The focus ring 208' is received over the extension 204c of the retaining feature 204 within a recess formed by a step 207 that separates the top surface 204a from the extension 204c. In this embodiment, the geometric profile of the focus ring 208' matches the geometric profile of the carrier plate 200a and is substantially rectangular in shape. This is in contrast to the geometric profile of the tapered portion 204b, focus ring 208 illustrated in FIG. 5A. Wafer supports 304 and carrier supports 306 are distributed in a fashion similar to what was shown in FIG. 5A. Further, a bottom surface of the carrier plate 200a is substantially flat and extends to an outer diameter of the pedestal 140. The profile of the bottom surface of the carrier plate 200a is straight and is different from the one shown in FIG. 5A.

Figures 1, 5C:
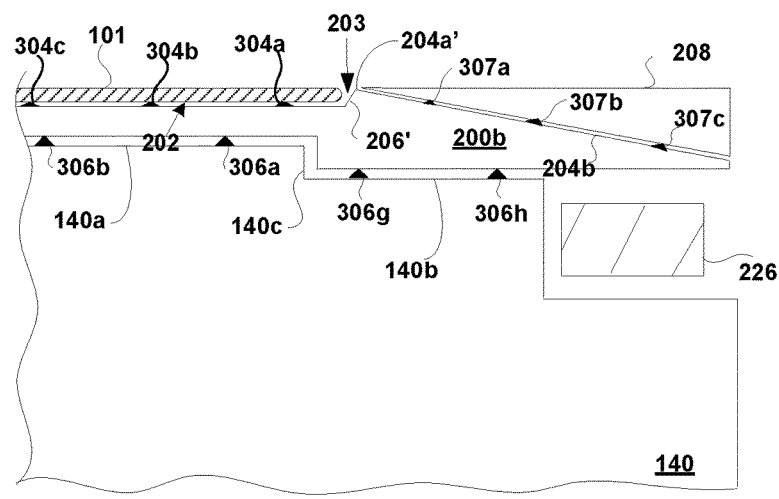
Figures 2, 5C:
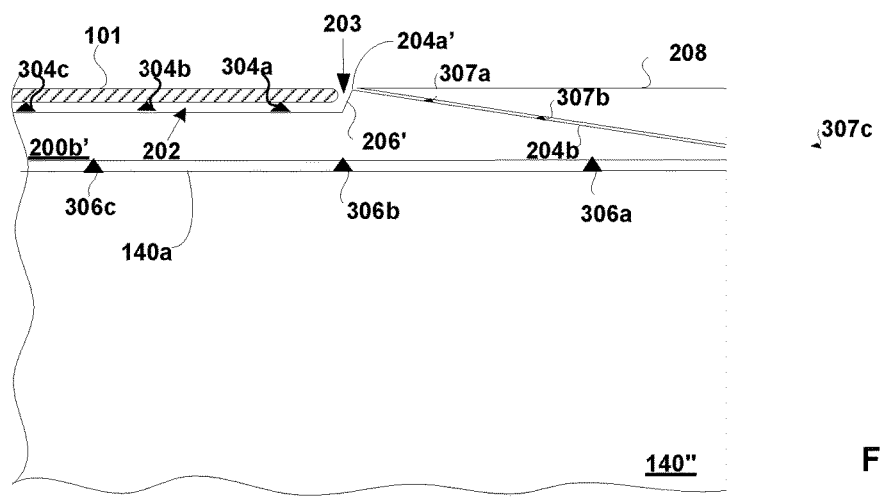

FIGS. 5C-1 and 5C-2 illustrate alternate embodiments wherein a top surface 204a' of the retaining feature 204 is shaped differently from the top surface 204 shown in FIG. 5A. In this embodiment, the top surface 204a' is pointed. The tapered portion 204b of the carrier plate 200b extends from the top surface 204a' over the annular surface 140b of the pedestal 140. In this embodiment, a tapered portion 204b of the retaining feature 204 extends outward from the pointed edge of the top surface 204a' to the outer diameter of the pedestal 140. In this embodiment, the step 206' has a sloped contour. As in FIG. 5A, the carrier plate with the tapered portion 204b has a wedge shape. The tapered portion 204b is configured to receive a focus ring 208 that is also wedge shaped. Ring supports 307 may be provided over the tapered portion 204b of the carrier plate 200 to provide a reliable support for the focus ring 208, when received. The bottom surface profile of the pedestal 140 is configured to include a central portion 140a, a vertical portion 140c and a horizontal portion 140b that are designed in a manner that are similar to the carrier plate 200 of FIG. 5A but is different from the bottom surface profile of FIG. 5B.

FIG. 5C-2 illustrates an alternate embodiment in which the carrier plate 200b' has a different bottom surface profile and the pedestal 140" has a different top surface profile than the one shown in FIG. 5C-1. In the embodiment illustrated in FIG. 5C-2, the top surface 140a of the pedestal 140" is substantially flat and extends to an outer diameter. There is no annular ring surface on the pedestal 140". The bottom surface profile of the carrier plate 200b' is also flat and is configured to sit on the carrier supports 306 disposed on the top surface 140a of the pedestal 140".

Figures 1, 5D:
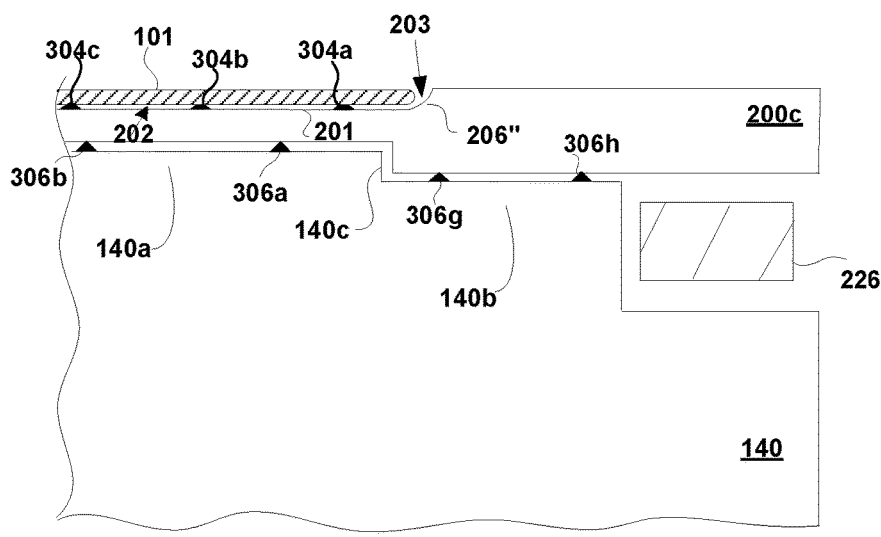
Figures 2, 5D:
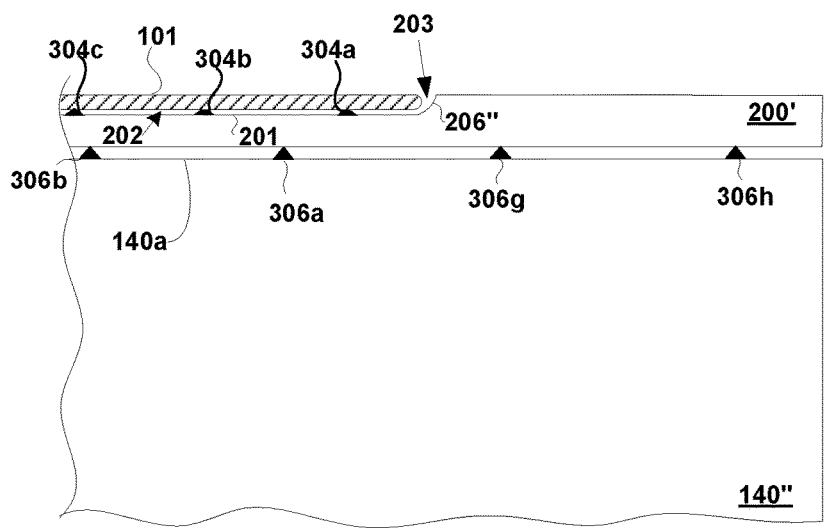

FIG. 5D-1 illustrates another embodiment in which the carrier plate 200c has a different geometric profile. The top surface of the carrier plate 200c adjacent to the step 206", in this embodiment, is sufficiently flat and flush with the top surface of the wafer 101, when the wafer is received on the substrate support region 201 of the carrier plate 200c. Further, the top surface of the carrier plate 200c is substantially parallel to the annular surface 140b of the pedestal. In this embodiment, the carrier plate 200 is a single piece structure and no separate focus ring 208 is provided in the carrier plate 200.

Further, the carrier plate 200, in this embodiment, does not include a retaining feature 204 or the tapered portion 204b. In an alternate embodiment, carrier plate may include the retaining feature 204 and the focus ring 208 may be integrally coupled to the retaining feature 204 of the carrier plate 200 to form a single unit. The top surface of the carrier plate-focus ring unit is flush with the top surface of the wafer 101, when received on the carrier plate 200. The geometric profile of the focus ring, in this embodiment, complements the geometric profile of the retaining feature 204. The profile of the step 206" is curvilinear. A bottom surface of the carrier plate 200c is designed in a manner similar to what was described with reference to FIGS. 5A and 5C.

FIG. 5D-2 illustrates yet another embodiment in which the bottom surface of the carrier plate 200c and a top surface 140a of the pedestal 140" are sufficiently flat and extend to an outer diameter. The profile of the pedestal 140" is similar to the embodiment illustrated in FIG. 5C-2. Further, as illustrated in FIG. 5D-1, the top surface of the carrier plate 200c is sufficiently flat and flush with the top surface of the wafer 101, when the wafer is received on the substrate support region 201 of the carrier plate 200c. In this embodiment, there is no separate focus ring disposed on the carrier plate 200c although in other embodiments, a separate focus ring may be provided and integrated with a retaining feature of the carrier plate 200c. A plurality of carrier supports are disposed on the top surface 140a of the pedestal 140", in some embodiments, for receiving the carrier plate. In alternate embodiments, a plurality of kinematic pins may be provided instead of the carrier supports, to align the carrier plate 200' with the pedestal 140". For example, three kinematic pins may be disposed uniformly on the top surface of the pedestal 140" and used to align the carrier plate 200' with the pedestal 140". The kinematic pins, when present on the pedestal 140", provide the reliable contact support for the carrier plate 200'. Thus, in accordance to the various embodiments, the carrier plate may be aligned and reliably supported on the pedestal using kinematic centering mechanism that engages kinematic pins or using other aligning features, such as carrier supports, groove-like features, etc.

FIG. 5E illustrates a cross-sectional view of the pedestal 140 over which the carrier plate 200 is received, in one embodiment. FIG. 5E-1 illustrates an expanded view of an edge portion 'B' of the carrier plate 200 to clearly illustrate the different parts of the carrier plate 200. Referring simultaneously to FIGS. 5E and 5E-1, the carrier plate 200 includes a substrate support region 201 defined in a pocket 202 formed in the middle section of the carrier plate 200, and a retaining feature 204. A top surface 204a of the retaining feature 204 is disposed adjacent to the step 206 forming the wall of the pocket 202. A tapered portion 204b is adjacent to the top surface 204a of the retaining feature 204. The tapered portion 204b extends to the outer diameter of the pedestal 140.

A bottom surface of the carrier plate 200, in this embodiment, is similar in profile to what was discussed with reference to FIGS. 5A, 5C and 5D. For example, a vertical portion of the bottom surface extends downward from an outer edge of a central portion for the height of the step 140c and a horizontal portion extends from the bottom of the vertical portion to the outer diameter of the pedestal 140. This extension may be used to align the carrier plate 200 when received on the pedestal 140. As shown, the carrier plate 200 includes a top surface 204a of a retaining feature 204 adjacent to the step 206, and a tapered portion 204b that extends from the retaining feature 204 to the outer diameter of the pedestal 140.

In some embodiments, the retaining feature 204 may include a recess formed by a step 207 defined on a side that is opposite to the side where the pocket is formed, to properly position the focus ring 208 when received on the tapered portion 204b. The step 207 extends from a top surface 204a downward to a third height. In one embodiment, a top side of the tapered portion 204b includes ring supports 307 (307a, 307b, 307c, 307d, 307e, 307f, etc.), to provide precision mating with a bottom surface of the focus ring 208. These ring supports 307 are in addition to the wafer supports 304 disposed on the top surface of the substrate support region 201 to support the wafer 101, when received, and carrier supports 306 provided on the top surface 140a of the pedestal 140 to support the carrier plate 200.

An ESC control 351 may be provided at the pedestal 140 to allow the pedestal 140 to act as an electrostatic chuck. The ESC control 351 is coupled to a plurality of electrodes 352a, 352b, 352c, 352d that are embedded in a body of the pedestal 140 closer to the top surface 140a of the pedestal 140. The ESC control 351 includes a power source to provide the voltage to the electrodes 352a-352d. The electrodes 352a-352d, may be uniformly distributed under the top surface 140a of the pedestal 140 or may be distributed along an outer periphery below the top surface 140a of the pedestal 140, or may be distributed below both the top surface 140a of the pedestal 140 and the annular surface 140b of the pedestal 140.

In some embodiments, the ESC control 351 is configured to provide bipolar clamping and de-clamping. In such embodiments, voltage applied to the electrodes 352a-352d, causes different types of charges (Q) (either positive or negative) to accumulate at the carrier plate 200 and the pedestal 140. The voltage applied may be dependent on type of material and thickness of the material used in the pedestal 140, the type of material and thickness of the material used in the carrier plate 200.

When the carrier plate 200 is received on top of the pedestal 140, the controller 110 generates a clamping signal that signals the ESC control 351 to apply sufficient voltage to cause a clamping force to be applied between the carrier plate 200 and the pedestal 140. In some embodiments, the voltage applied may be between about 500 Volts to about 4000 Volts. For example, when the voltage is applied at the electrodes 352a-352d, the charges migrate vertically such that the positive charge migrates to the carrier plate 200 and the negative charge remains at the pedestal 140 or the negative charge migrates to the carrier plate 200 and positive charge remains at the pedestal 140. This vertical motion of charges causes a time-dependent attractive force to develop at the pedestal-carrier plate interface that transcends to the carrier plate-wafer interface. The attractive force is caused by the accumulation of opposite types of charges ($Q^+$, $Q^-$) at each of the carrier plate 200 and the pedestal 140 and is stronger at the pedestal-carrier plate interface than at the carrier plate-wafer interface.

When the carrier plate 200 is to be removed from the pedestal, the controller 110 generates a de-clamping signal that causes the ESC control 351 to apply a reverse voltage at the electrodes 352a-352d. In one embodiment, the time and the de-clamping voltage can be controlled so as to cause the carrier plate 200 to de-clamp from the pedestal 140. As with the clamping force, the reverse voltage causes a time-dependent de-clamp force to be applied that causes a faster discharge at the carrier plate-pedestal interface than at the carrier plate-wafer interface. This differential rate of de-clamp force allows the carrier plate 200 to be lifted off the pedestal 140 while some residual charge remaining at the carrier plate-wafer interface will keep the wafer 101 clamped to the substrate support region 201 of the carrier plate 200.

By way of example, controlling the amount of reverse voltage applied allows the carrier plate-pedestal interface to exhibit Coulombic chuck properties by de-chucking at a faster rate while the carrier plate-wafer interface exhibits Johnsen-Rahbek chuck properties by de-chucking at a slower rate. This differential de-chucking enables the carrier plate 200 to be lifted and moved from one process station to another while keeping the wafer clamped in place during the transfer. In some embodiments, the time constants and the reverse voltage applied are monitored to ensure that sufficient time is available to transfer the carrier plate 200 with the wafer 101 before the next clamping charge is applied at the next station.

In some embodiments, the signal provided by the controller 110 indicates the amount of voltage and reverse voltage to be applied at the electrodes 352a-352d by the ESC control 351. The signal takes into account the time factor, the thickness of the substrate support region, thickness of the wafer, the amount of voltage to be applied, and other chucking/de-chucking parameters, so that sufficient attractive force is applied during clamping operation and the discharge occurs in a controlled manner during the de-clamping operation. Since the strength of the clamping or de-clamping force is stronger closer to where the voltage or reverse voltage is applied (i.e., pedestal-carrier plate interface) and attenuates as the charges move further away, close monitoring of the applied voltage and time constants will ensure that the wafer 101 stays clamped to the carrier plate 200 while being moved into and out of the process chamber as well as from one process station to another process station. It should be noted that the above way of providing differential de-chucking is one example of ensuring that the wafer does not move during transfer of the carrier plate from one process station to another process station and that other ways of differential de-chucking can also be employed.

In some embodiments, the carrier plate 200 may be pre-loaded with the wafer 101 outside of the process chamber 102 and then moved into the process chamber 102. The wafer may be clamped to the carrier plate 200 during the pre-loading process. In such embodiments, the carrier plate 200 with the wafer 101 loaded is moved into and out of the process chamber using differential chucking/de-chucking process that was explained with reference to FIGS. 5E, 5E-1 or by other similar means.

In some embodiments, to effectively perform the differential chucking and de-chucking, portions of the carrier plate 200 may be made of dielectric material. In alternate embodiments, the carrier plate may be made of alternating layers of ceramic with metal layer in-between.

FIGS. 5F-1 and 5F-2 illustrate cross-section view of the pedestal 140 with a lift pin mechanism to lift and lower the carrier plate 200, in one embodiment. The pedestal 140 includes a lift pin mechanism that engages a plurality of lift pins 120, with each lift pin disposed in a recess defined on the top surface 140a of the pedestal 140. In some embodiments, additional lift pins 120 may be provided in corresponding recesses defined on the annular surface 140b of the pedestal 140. The lift pins 120 are connected to a lift pin control 122 that is coupled to the controller 110. Appropriate signal is sent to the lift pin control 122 by the controller 110 when the lift pins need to be engaged or disengaged. When the lift pins are disengaged, the lift pins retract into the respective housing, as illustrated in FIG. 5F-1.

When the lift pins are engaged, the lift pins extend from the respective housing through corresponding recesses to lift the carrier plate 200. FIG. 5F-2 illustrates one such embodiment wherein the lift pins are engaged and the carrier plate 200 with the wafer 101 received thereon is lifted off the top surface of the pedestal 140. The signal to disengage the lift pins is coordinated with the signal to clamp the carrier plate 200 to the pedestal 140. Similarly, the signal to engage the lift pins 120 is coordinated with the signal to de-clamp the carrier plate 200 so that the carrier plate 200 with the wafer 101 received thereon can be moved from the pedestal 140. In the embodiment illustrated in FIG. 5F-1, three lift pins 120 are distributed uniformly in a body of the pedestal 140. In alternate embodiments, plurality of lift pins 120 may be distributed uniformly along the peripheral region of the body of the pedestal 140 or distributed uniformly in the body of the pedestal 140.

In some embodiments, in addition to the signals to clamp or de-clamp the carrier plate, a signal may be generated to lift the wafer 101 from the carrier plate 200. This might be the case when the processing of the wafer is completed and the processed wafer is to be moved out of the process chamber 102, for example. When the wafer 101 is to be lifted from the carrier plate 200, a signal is sent from the controller 110 to the lift pin control 122 to engage the lift pins to extend through the respective recesses formed on the top surface of the pedestal 140 and through the corresponding recesses defined on the top surface of the substrate support region 201 of the carrier plate 200. In such embodiments, the carrier plate 200 is aligned with the pedestal 140 such that the respective recesses through which the lift pins can be extended, are properly aligned. Thus, the signal from the controller 110 enables the lift pins to be selectively extended so that appropriate component (e.g., the carrier plate or the wafer) can be lifted.

The various embodiments describe an arrangement that includes a carrier plate that extends completely under the wafer 101. This arrangement eliminates gaps under the edge of the wafer 101 thereby addressing the demerits of a conventional carrier ring arrangement. In various embodiments, the wafer 101 sits on and the features surrounding the wafer 101 are a single piece, movement of the carrier plate-wafer system does not result in making and breaking contact to effect wafer movement as the wafer 101 is in constant contact with the carrier plate 200 (e.g., MCAs formed on the carrier plate).

Further, in some embodiments, the wafer 101 may be located in a pocket 202 formed in the carrier plate 200, wherein the sides and bottom of the pocket 202 are continuous as they are fabricated as a single component. Precision wafer-carrier plate spacing features, such as MCAs, can be quite small as they can be fabricated into the carrier plate 200 directly. Usually, such high precision spacing features can be fabricated by grinding in ceramic (i.e., material used to make the carrier plate), for example In some embodiments, since pedestal 140 made of ceramic are expensive, a low cost alternative may be employed by using a hybrid solution, wherein the carrier plate 200 is made of ceramic while the pedestal 140 is made of metal, such as aluminum. The hybrid solution is not restricted to the aforementioned material and that other materials may be employed for the carrier plate 200 and the pedestal 140 while still keeping it low cost and maintaining the functionality for which the carrier plate 200 and the pedestal 140 are designed.

In addition, in some embodiments, the carrier plate 200 can incorporate an electrostatic chuck (ESC) mechanism. The ESC mechanism can be charged when the wafer 101 is first placed upon it, and if the application temperature is not too high, then the wafer 101 can remain attached to the carrier plate 200 during transfer without any power being applied. The application temperature may be controlled by the controller 110, in some embodiments, using the process recipes provided by the process input and control 108. The attachment of the wafer 101 during transfer has the advantage that no wafer sliding occurs during transport. The ESC clamping voltage can be capacitively coupled in with no direct, direct current (DC) electrical contact. FIG. 5F-1 illustrates the capacitive coupling that occurs at the carrier plate-pedestal interface that transcends to the carrier plate-wafer interface when the carrier plate is clamped to the pedestal. FIG. 5F-2 illustrates the residual capacitive coupling that remains at the carrier plate-wafer interface clamping the wafer to the carrier plate even when the carrier plate is de-clamped from the pedestal.

In some embodiments, the carrier plate includes a separate focus ring component. In other embodiments, the focus ring may or may not be a separate piece and the relative geometry of the focus ring and a retaining feature of the carrier plate can vary and complement one another.

The various embodiments overcome the limitations of traditional carrier ring assemblies by preserving the simplicity and throughput benefits of carrier ring transfer while overcoming the various demerits associated with the traditional carrier ring assemblies. Some of the benefits of the various embodiments described herein are as follows. One of the benefits includes elimination of temperature discontinuity at the wafer edge. This is because the wafer surface transitions to the top surface of the retaining feature of the carrier plate without much break. Gaps around the edge of the wafer are eliminated. These gaps resulted in unnecessary parasitic plasma light-up. Particle contamination at the edge and underside of the wafer is reduced as the carrier plate provides a high precision pocket feature extending under the wafer and wrapping around the critical region near the wafer edge. The carrier plate remains in contact with the wafer as the carrier plate is moved as a unit from one station to another inside the process chamber and from one process chamber to another process chamber. There is no need for a separate transfer mechanism to lift the wafer out of the pocket. The carrier plate provides a surface upon which the wafer can be placed with high precision by a robot without incurring cumulative eccentricity due to traditional spindle-carrier ring handoff. This is especially true when the ESC clamping mechanism is employed between the wafer and the carrier plate. The carrier plate provides a low cost solution by providing a high precision, ceramic surface under the wafer and a low cost metal (e.g., aluminum) pedestal on which the carrier plate with the wafer is received.

Figure 6:
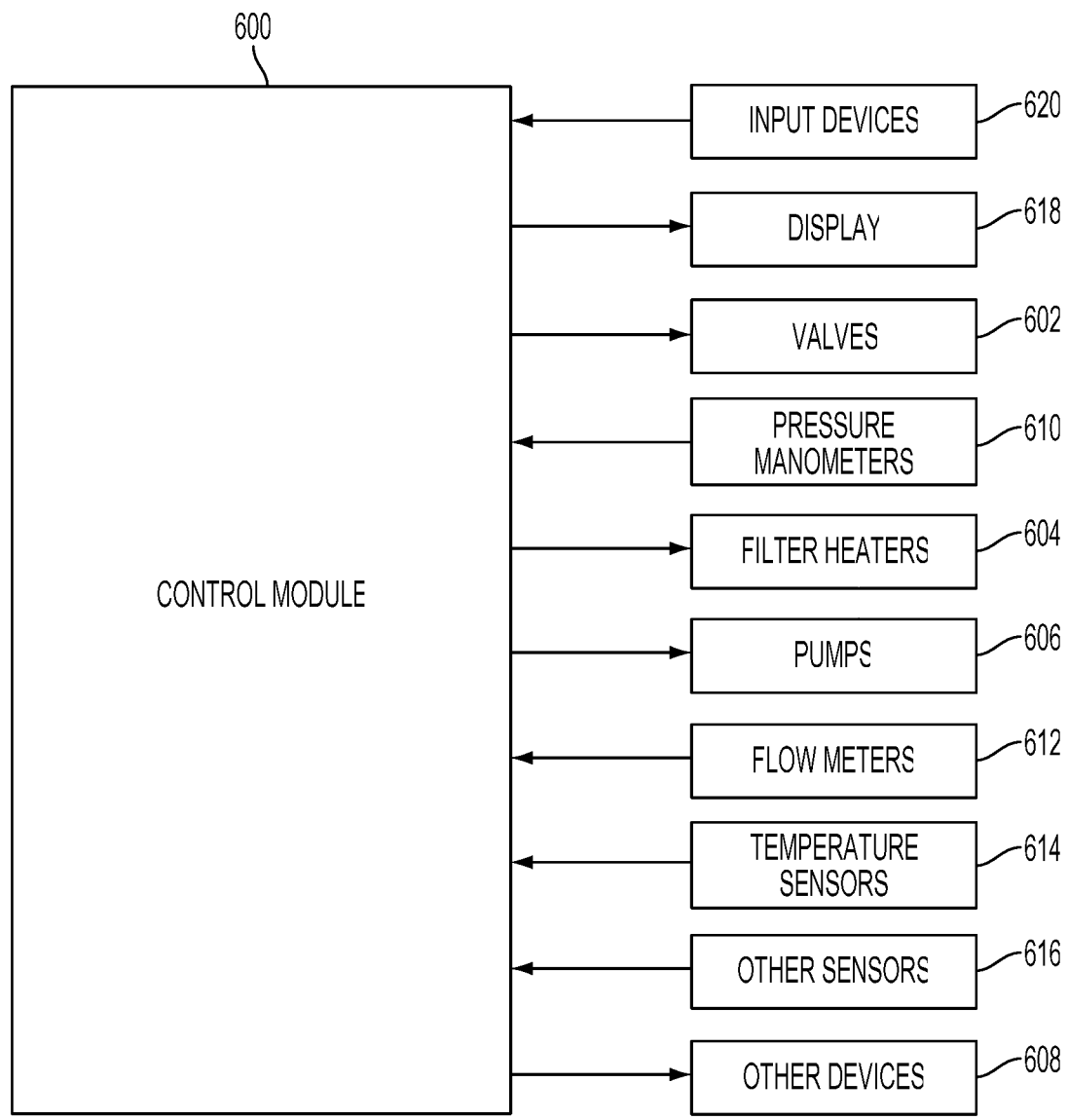
FIG. 6 shows a control module (i.e., controller) for controlling the systems, in accordance with one embodiment.

FIG. 6 shows a control module 600 for controlling the systems described above. In one embodiment, the control module 110 illustrated in the various Figures may include some of the example components. For instance, the control module 600 may include a processor, memory and one or more interfaces. The control module 600 may be employed to control devices in the system based in part on sensed values. For example only, the control module 600 may control one or more of valves 602, filter heaters 604, pumps 606, and other devices 608 based on the sensed values and other control parameters. The control module 600 receives the sensed values from, for example only, pressure manometers 610, flow meters 612, temperature sensors 614, and/or other sensors 616. The control module 600 may also be employed to control process conditions during precursor delivery and deposition of the film. The control module 600 will typically include one or more memory devices and one or more processors.

The control module 600 may control activities of the precursor delivery system and deposition apparatus. The control module 600 executes computer programs including sets of instructions for controlling process timing, delivery system temperature, pressure differentials across the filters, valve positions, mixture of gases, chamber pressure, chamber temperature, wafer temperature, radio frequency (RF) power levels, wafer chuck or pedestal position, and other parameters of a particular process. The control module 600 may also monitor the pressure differential and automatically switch vapor precursor delivery from one or more paths to one or more other paths. Other computer programs stored on memory devices associated with the control module 600 may be employed in some embodiments.

Typically there will be a user interface associated with the control module 600.

The user interface may include a display 618 (e.g. a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 610, and thermocouples located in delivery system, the pedestal or chuck (e.g. the temperature sensors 614). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. A carrier plate for receiving a wafer, the carrier plate received over a pedestal of a process chamber, the carrier plate comprising:
    a pocket defined in a middle section on a top surface of the carrier plate, the pocket defines a substrate support region and covers at least a surface diameter;
    a retaining feature disposed adjacent to an outer edge of the pocket, such that a top surface of the retaining feature is adjacent to a step of the pocket, the retaining feature includes,
        a second step disposed on a side opposite to the step, and
        a tapered portion that tapers down from a bottom edge of the second step of the retaining feature to an outer diameter of the pedestal to define an angled recess, the angled recess formed on a top surface of the tapered portion configured to receive a focus ring, such that a top surface of the focus ring is co-planar with the top surface of the retaining feature and a top surface of the wafer, when the wafer is received in the pocket;
    a bottom surface of the carrier plate is configured to be received over the pedestal used in the process chamber, wherein a geometrical profile of the bottom surface of the carrier plate matches a geometrical profile of a top surface of the pedestal; and
    a plurality of wafer supports disposed on a top surface of the substrate support region to support the wafer, when received.

2. The carrier plate of claim 1, wherein the bottom surface of the carrier plate is contoured to match the geometrical profile of the top surface of the pedestal, and
    wherein the top surface of the pedestal includes a central portion, a vertical portion and a horizontal portion, the central portion extending the surface diameter, the vertical portion extends downward from an outer edge of the central portion for a second height, the horizontal portion extends from a bottom of the vertical portion toward the outer diameter.

3. The carrier plate of claim 2, wherein the second height is about 4 mm.

4. The carrier plate of claim 1, wherein the top surface of the pedestal is flat, and wherein a geometrical profile of the bottom surface of the carrier plate is substantially flat to match the flat profile of the top surface of the pedestal.

5. The carrier plate of claim 1, wherein the bottom surface of the carrier plate extends to the outer diameter.

6. The carrier plate of claim 1, wherein the carrier plate is a detachable unit and is configured to be moved into and out of the process chamber with the wafer received thereon.

7. The carrier plate of claim 1, wherein the surface diameter of the pocket is at least a diameter of the wafer received on the carrier plate.

8. The carrier plate of claim 1, wherein a geometrical profile of the focus ring matches a geometrical profile of the tapered portion of the carrier plate.

9. The carrier plate of claim 1, wherein the focus ring is integrally coupled to the tapered portion of the carrier plate.

10. The carrier plate of claim 1, wherein the plurality of wafer supports define minimum contact areas for supporting the wafer, when received.

11. The carrier plate of claim 1, wherein the top surface of the tapered portion includes a plurality of ring supports to provide minimum contact areas for supporting the focus ring, when received.

12. The carrier plate of claim 1, further includes a plurality of recesses disposed on a top surface of the substrate support region to allow lift pins distributed in a body of the pedestal on which the carrier plate is received, to extend through, when activated, wherein the lift pins are configured to lift the wafer, when activated.

13. A process chamber for processing a wafer, comprising:
a pedestal configured to support a carrier plate, a top surface of the pedestal extends to at least an outer diameter;
the carrier plate configured to be disposed on the pedestal, the carrier plate comprising:
  a pocket defined in a middle section on a top surface of the carrier plate and configured to extend a surface diameter, the pocket defines a substrate support region;
  a retaining feature disposed adjacent to an outer edge of the pocket, such that a top surface of the retaining feature is adjacent to a step of the pocket, the retaining feature includes,
    a second step disposed on a side opposite to the step, and
    a tapered portion that tapers down from a bottom edge of the second step of the retaining feature to the outer diameter of the pedestal to define an angled recess, the angled recess formed on a top surface of the tapered portion configured to receive a focus ring, such that a top surface of the focus ring is co-planar with the top surface of the retaining feature and a top surface of the wafer, when the wafer is received in the pocket;
  a bottom surface of the carrier plate is configured to be received over the pedestal within the process chamber, wherein a geometrical profile of the bottom surface of the carrier plate matches a geometrical profile of a top surface of the pedestal; and
  a plurality of wafer supports disposed on a top surface of the substrate support region to support the wafer, when received.

14. The process chamber of claim 13, wherein the carrier plate is a detachable unit and is configured to be moved into and out of the process chamber with the wafer received thereon.

15. The process chamber of claim 13, wherein the top surface of the pedestal includes a central portion, a vertical portion and a horizontal portion, the central portion extending the surface diameter, the vertical portion extends downward from an outer edge of the central portion for a second height, the horizontal portion extends from a bottom of the vertical portion toward the outer diameter, and
  wherein the bottom surface of the carrier plate is contoured to match the geometrical profile of the top surface of the pedestal.

16. The process chamber of claim 13, wherein the top surface of the pedestal is flat, and wherein a geometrical profile of the bottom surface of the carrier plate is substantially flat to match the geometrical profile of the top surface of the pedestal.

17. The process chamber of claim 13, further includes a lifting mechanism integrated within the pedestal and coupled to a controller, the lifting mechanism configured to lift the carrier plate based on a signal from the controller, wherein the signal is a de-clamping signal.

18. The process chamber of claim 13, further includes a plurality of lift pins distributed throughout a body of the pedestal, each of the plurality of lift pins configured to extend outward through a corresponding recess defined on the top surface of the pedestal and lift the carrier plate, when engaged, and retract into a housing when disengaged, the plurality of lift pins connected to a lift pin control, the lift pin control is coupled to a controller and is configured to engage, disengage the plurality of lift pins in response to a signal from the controller.

19. The process chamber of claim 13, further includes a plurality of electrodes disposed inside a body of the pedestal proximal to the top surface of the pedestal, the plurality of electrodes coupled to an electrostatic chuck (ESC) control, the ESC control is configured to apply voltage to the plurality of electrodes to induce bipolar clamping or de-clamping between the pedestal and the carrier plate, when the carrier plate is received over the pedestal, the voltage for clamping or de-clamping applied in response to a signal received from a controller coupled to the ESC control.

* * * * *